(12) United States Patent
Xu et al.

(10) Patent No.: US 11,456,030 B2
(45) Date of Patent: Sep. 27, 2022

(54) STATIC RANDOM ACCESS MEMORY SRAM UNIT AND RELATED APPARATUS

(71) Applicants: Huawei Technologies Co., Ltd., Shenzhen (CN); Tsinghua University, Beijing (CN)

(72) Inventors: Han Xu, Beijing (CN); Fei Qiao, Beijing (CN); Miao Zheng, Hangzhou (CN)

(73) Assignees: Huawei Technologies Co., Ltd., Shenzhen (CN); Tsinghua University, Beijing (CN)

( * ) Notice: Subject to any disclaimer, the term of this patent is extended or adjusted under 35 U.S.C. 154(b) by 0 days.

(21) Appl. No.: 17/187,455

(22) Filed: Feb. 26, 2021

(65) Prior Publication Data

US 2021/0183430 A1 Jun. 17, 2021

Related U.S. Application Data

(63) Continuation of application No. PCT/CN2019/099132, filed on Aug. 2, 2019.

(30) Foreign Application Priority Data

Aug. 31, 2018 (CN) .......................... 201811014610.1

(51) Int. Cl.
*G11C 11/412* (2006.01)
*G11C 11/4094* (2006.01)
(Continued)

(52) U.S. Cl.
CPC ............ *G11C 11/4094* (2013.01); *G11C 5/06* (2013.01); *G11C 11/4074* (2013.01); *G11C 11/4085* (2013.01); *H03K 19/01742* (2013.01)

(58) Field of Classification Search
CPC .................................................. G11C 11/4094
See application file for complete search history.

(56) References Cited

U.S. PATENT DOCUMENTS 5,671,182 A * 9/1997 Yin .................... G11C 11/36
365/175
6,285,590 B1 9/2001 Poplevine et al.
(Continued)

FOREIGN PATENT DOCUMENTS

CN 101034585 A 9/2007
CN 101110261 A 1/2008
(Continued)

OTHER PUBLICATIONS

Chen et al., "A Multi-Accuracy-Level Approximate Memory Architecture Based on Data Significance Analysis," 2016 IEEE Computer Society Annual Symposium on VLSI, pp. 385-390, Institute of Electrical and Electronics Engineers, New York, New York (Jul. 2016).

*Primary Examiner* — Min Huang
(74) *Attorney, Agent, or Firm* — Leydig, Voit & Mayer, Ltd.

(57) ABSTRACT

A static random access memory SRAM unit and a related apparatus are provided, to reduce power consumption of an SRAM when the SRAM memory is accessed. The SRAM unit is located in an SRAM memory, and the SRAM memory includes an SRAM storage array including a plurality of SRAM units. The SRAM unit includes: a storage circuit, connected to each of a write circuit and a read circuit, and configured to store data; the write circuit, configured to write data into the storage circuit; and the read circuit, configured to: after a read enabling signal is valid, enable data on a read bit line connected to the SRAM unit to be the data stored in the storage circuit.

13 Claims, 11 Drawing Sheets

(51) Int. Cl.
*G11C 5/06* (2006.01)
*G11C 11/4074* (2006.01)
*G11C 11/408* (2006.01)
*H03K 19/017* (2006.01)

(56) References Cited

U.S. PATENT DOCUMENTS

| | | |
|---|---|---|
| 6,301,174 B1 | 10/2001 | Chung |
| 2002/0075731 A1* | 6/2002 | Amano .................... G11C 7/22 365/208 |
| 2003/0198120 A1 | 10/2003 | Nagano |
| 2008/0137450 A1 | 6/2008 | Lee et al. |
| 2008/0250257 A1 | 10/2008 | Brown |
| 2010/0142258 A1 | 6/2010 | Tsai et al. |
| 2010/0309740 A1 | 12/2010 | Arsovski et al. |
| 2011/0261064 A1 | 10/2011 | Gold et al. |
| 2013/0182492 A1 | 7/2013 | Houston |
| 2014/0092673 A1 | 4/2014 | Li et al. |
| 2014/0112060 A1 | 4/2014 | Adams et al. |
| 2017/0206948 A1 | 7/2017 | Hebig et al. |
| 2019/0189199 A1* | 6/2019 | Noel .................... G11C 7/1006 |

FOREIGN PATENT DOCUMENTS

| | | |
|---|---|---|
| CN | 101217059 A | 7/2008 |
| CN | 101290797 A | 10/2008 |
| CN | 102385916 A | 3/2012 |
| CN | 102411990 A | 4/2012 |

\* cited by examiner

STATIC RANDOM ACCESS MEMORY SRAM UNIT AND RELATED APPARATUS

CROSS-REFERENCE TO RELATED APPLICATIONS

This application is a continuation of International Application No. PCT/CN2019/099132, filed on Aug. 2, 2019, which claims priority to Chinese Patent Application No. 201811014610.1, filed on Aug. 31, 2018. The disclosures of the aforementioned applications are hereby incorporated by reference in their entireties.

TECHNICAL FIELD

Embodiments of this application relate to the field of semiconductor technologies, and in particular, to a static random access memory (SRAM) unit and a related apparatus.

BACKGROUND

A static random access memory (SRAM) is a storage device with a static access function, can maintain, without circuit refreshing, data stored therein, and is widely used in design of digital products and various electronic circuit products. When a read/write operation is performed on the SRAM, a bit line of the SRAM needs to be charged and discharged. Therefore, frequent read/write operations on the SRAM cause relatively high power consumption of the SRAM. This limits a processing speed of a processor that needs to frequently access the SRAM.

For example, a storage unit of the SRAM is a conventional 6T-SRAM unit. As shown in FIG. 1, the 6T-SRAM unit includes six transistors: a transistor M1 to a transistor M6. When data stored in the 6T-SRAM unit is Q=0 (that is, a low level) and QB=1 (that is, a high level), during a read operation on the 6T-SRAM unit, two differential bit lines BL and BLB are precharged to a high level, that is, a power supply voltage VDD, the transistor M1 and the transistor M2 are turned on, the bit line BL is pulled down by the transistor M1 and the transistor M3 to a low level, the bit line BLB maintains the high level, and "0" is read. When the data stored in the 6T-SRAM unit is Q=1 and QB=0, during the read operation on the 6T-SRAM unit, the two differential bit lines BL and BLB are precharged to the VDD, the transistor M1 and the transistor M2 are turned on, the bit line BLB is pulled down by the transistor M2 and the transistor M4 to a low level, the bit line BL maintains a high level, and "1" is read. That is, when the read operation is performed on the SRAM, a level of one bit line always decreases and electric energy is consumed during precharging.

SUMMARY

This application provides a static random access memory SRAM unit and a related apparatus, to reduce power consumption of a static random access memory SRAM when the SRAM is accessed.

According to a first aspect, this application provides an SRAM unit, where the SRAM unit is located in an SRAM memory, and the SRAM memory includes an SRAM storage array including a plurality of SRAM units. Specifically, the SRAM unit includes: a storage circuit, a write circuit, and a read circuit. The storage circuit is connected to each of the write circuit and the read circuit, and is configured to store data, where the data is first data or second data, the first data is represented by a high level, and the second data is represented by a low level. The write circuit is further connected to a write word line and a write bit line, and is configured to write data into the storage circuit. The read circuit is further connected to a read enabling signal end and a read bit line. When a first quantity of SRAM units that store the first data and that are in a column of the SRAM unit in the SRAM storage array is greater than a second quantity of SRAM units that store the second data and that are in the column, the read bit line is charged to a high level after the SRAM memory receives a read command and before a read enabling signal at the read enabling signal end is valid. When the first quantity is less than the second quantity, the read bit line is discharged to a low level after the SRAM memory receives the read command and before the read enabling signal is valid. The read circuit is configured to: after the read enabling signal is valid, enable data on the read bit line to be the data stored in the storage circuit.

In the foregoing solution, when the quantity of the SRAM units that store the first data and that are in the column of the SRAM unit is greater than the quantity of the SRAM units that store the second data and that are in the column, the read bit line connected to the SRAM unit is precharged to a high level, so that when the read circuit reads the first data next time, charging the read bit line consumes no energy; and when the quantity of the SRAM units that store the first data and that are in the column of the SRAM unit is less than the quantity of the SRAM units that store the second data and that are in the column, the read bit line is pre-discharged to a low level, so that when the read circuit reads the second data next time, no energy is consumed. That is, the SRAM memory can adjust a working structure of the SRAM memory based on a quantity of SRAM units that store the first data and that are in a column of SRAM units of the SRAM memory, and a quantity of SRAM units that store the second data and that are in the column, to avoid as much as possible that charging the read bit line connected to the SRAM unit consumes energy during a read operation on the SRAM unit of the SRAM memory, thereby reducing power consumption of the SRAM memory.

In a possible implementation, the read circuit may be implemented in manners including, but not limited to, the following two manners:

Manner 1: The read circuit includes a first pull-up transistor, a first pull-down transistor, a first read transmission transistor, and a second read transmission transistor. A gate of the first pull-up transistor is connected to each of a gate of the first pull-down transistor and the storage circuit, a source of the first pull-up transistor is connected to a drain of a second pull-up transistor, and a drain of the first pull-up transistor is connected to each of a drain of the first pull-down transistor, a source of the first read transmission transistor, and a drain of the second read transmission transistor. A source of the first pull-down transistor is connected to a drain of a second pull-down transistor, a source of the second pull-down transistor is grounded, and a source of the second pull-up transistor is connected to a power supply. A gate of the second pull-up transistor and a gate of the second pull-down transistor are used to receive a first read control signal or a second read control signal. A drain of the first read transmission transistor is connected to each of a source of the second read transmission transistor and the read bit line, a gate of the first read transmission transistor is connected to a first read enabling signal end, and a gate of the second read transmission transistor is connected to a second read enabling signal end. The read enabling signal end includes the first read enabling signal end and the second read enabling signal end.

When the gate of the second pull-up transistor and the gate of the second pull-down transistor receive the first read control signal, the second pull-up transistor is in an off state, and the second pull-down transistor is in an on state. When the gate of the second pull-up transistor and the gate of the second pull-down transistor receive the second read control signal, the second pull-up transistor is in the on state, and the second pull-down transistor is in the off state. When a first read enabling signal at the first read enabling signal end is valid, and the second read enabling signal at the second read enabling signal end is valid, both the first read transmission transistor and the second read transmission transistor are in the on state. The read enabling signal includes the first read enabling signal and the second read enabling signal, and the second read enabling signal is a phase-inverted signal of the first read enabling signal.

It should be noted that the first read control signal and the second read control signal are at two different levels of a read control signal inputted from a same read control signal end, that is, the first read enabling signal end and the second read enabling signal end are a same input end. The first read enabling signal and the second read enabling signal are two signals.

Manner 2: The read circuit may include a first pull-up transistor, a first pull-down transistor, a first read transmission transistor, and a second read transmission transistor. A gate of the first pull-up transistor is connected to each of a gate of the first pull-down transistor and the storage circuit, a source of the first pull-up transistor is connected to a drain of a second pull-up transistor, and a drain of the first pull-up transistor is connected to each of a drain of the first pull-down transistor and a source of a third read transmission transistor. A source of the first pull-down transistor is connected to a drain of a second pull-down transistor, a source of the second pull-down transistor is grounded, and a source of the second pull-up transistor is connected to a power supply. A gate of the second pull-up transistor and a gate of the second pull-down transistor are used to receive the first read control signal or the second read control signal. A drain of the third read transmission transistor is connected to the read bit line, and a gate of the third read transmission transistor is connected to the read enabling signal end.

When the gate of the second pull-up transistor and the gate of the second pull-down transistor receive the first read control signal, the second pull-up transistor is in an off state, and the second pull-down transistor is in an on state. When the gate of the second pull-up transistor and the gate of the second pull-down transistor receive the second read control signal, the second pull-up transistor is in the on state, and the second pull-down transistor is in the off state. When the read enabling signal at the read enabling signal end is valid, the third read transmission transistor is in the on state.

Further, the first pull-up transistor, the second pull-up transistor, and the first read transmission transistor are P-channel field-effect transistors. The first pull-down transistor, the second pull-down transistor, and the second read transmission transistor are N-channel field-effect transistors.

In a possible implementation, the storage circuit includes a third pull-up transistor, a fourth pull-up transistor, a third pull-down transistor, and a fourth pull-down transistor. Both a source of the third pull-up transistor and a source of the fourth pull-up transistor are connected to the power supply. A gate of the third pull-up transistor is connected to each of a gate of the third pull-down transistor, a drain of the fourth pull-up transistor, a drain of the fourth pull-down transistor, the read circuit, and the write circuit. A gate of the fourth pull-up transistor is connected to each of a gate of the fourth pull-down transistor, a drain of the third pull-up transistor, a drain of the third pull-down transistor, and the write circuit. Both a source of the third pull-down transistor and a source of the fourth pull-down transistor are grounded.

Further, the third pull-up transistor and the fourth pull-up transistor are P-channel field-effect transistors. The third pull-down transistor and the fourth pull-down transistor are N-channel field-effect transistors.

In a possible implementation, the write circuit includes a first write transmission transistor and a second write transmission transistor. A source of the first write transmission transistor is connected to a first write bit line, a gate of the first write transmission transistor is connected to the write word line, and a drain of the first write transmission transistor is connected to each of the drain of the third pull-up transistor and the gate of the fourth pull-up transistor. A drain of the second write transmission transistor is connected to each of the drain of the fourth pull-up transistor and the gate of the third pull-up transistor, a source of the second write transmission transistor is connected to a second write bit line, and a gate of the second write transmission transistor is connected to the write word line. The write bit line includes the first write bit line and the second write bit line. When the write circuit writes data into the storage circuit, both the first write transmission transistor and the second write transmission transistor are in the on state. The first write bit line and the second write bit line have inverted phases.

Further, both the first write transmission transistor and the second write transmission transistor are N-channel field-effect transistors.

According to a second aspect, this application provides an SRAM memory, where the SRAM memory includes a plurality of SRAM units according to any one of the implementations of the first aspect.

In the foregoing solution, the SRAM memory can adjust a working structure of the SRAM memory based on a quantity of SRAM units that store first data and that are in a column of SRAM units of the SRAM memory, and a quantity of SRAM units that store second data and that are in the column, to reduce as much as possible energy consumed, during a read operation on the SRAM unit of the SRAM memory, by charging a read bit line connected to the SRAM unit, thereby reducing power consumption of the SRAM memory.

In a possible implementation, the SRAM memory further includes N data statistics collection circuits, N multiplexers, and M×N read control signal storage circuits, where N is equal to a data bit width. Each bit of data corresponding to the data bit width corresponds to M columns in an SRAM storage array, the N data statistics collection circuits are in a one-to-one correspondence with the multiplexers, and the SRAM storage array includes M×N columns of SRAM units. Each of the N data statistics collection circuits is connected to M of the read control signal storage circuits through a corresponding multiplexer, and each of the M×N read control signal storage circuits is connected to one column of SRAM units in the SRAM storage array.

The data statistics collection circuit is configured to: collect statistics on a quantity of pieces of first data and a quantity of pieces of second data in data that needs to be written into a target SRAM unit, where the target SRAM unit is a column of SRAM units that are connected to the data statistics collection circuit and that are in the SRAM storage array; when the quantity of pieces of first data is greater than the quantity of pieces of second data, generate a first read control signal used to control a read bit line to be charged to a high level, and when the quantity of pieces of first data is less than the quantity of pieces of second data, generate a second read control signal used to control the read bit line to be discharged to a low level.

A read control signal storage circuit connected to the target SRAM unit is configured to store the first read control signal or the second read control signal, where the first read control signal is at a high level and the second read control signal is at a low level.

In a possible implementation, the SRAM memory further includes: M×N data statistics collection circuits and M×N read control signal storage circuits, where N is equal to a data bit width. Each bit of data corresponding to the data bit width corresponds to M columns in an SRAM storage array, and the SRAM storage array includes M×N columns of SRAM units. The M×N data statistics collection circuits are in a one-to-one correspondence with the M×N columns of SRAM units, and each of the data statistics collection circuits is connected to one column of SRAM units through one of the read control signal storage circuits.

The data statistics collection circuit is configured to: collect statistics on a quantity of pieces of first data and a quantity of pieces of second data in data that needs to be written into a target SRAM unit, where the target SRAM unit is a column of SRAM units that are connected to the data statistics collection circuit and that are in the SRAM storage array; when the quantity of pieces of first data is greater than the quantity of pieces of second data, generate a first read control signal used to control a read bit line to be charged to a high level, and when the quantity of pieces of first data is less than the quantity of pieces of second data, generate a second read control signal used to control the read bit line to be discharged to a low level.

A read control signal storage circuit connected to the target SRAM unit is configured to store the first read control signal or the second read control signal, where the first read control signal is at a high level and the second read control signal is at a low level.

In a possible implementation, the data statistics collection circuit includes a counting circuit and a comparison circuit. The counting circuit is configured to collect statistics on a first quantity of pieces of first data and a second quantity of pieces of second data in the data that needs to be written into the target SRAM unit. The comparison circuit is configured to: compare the first quantity with the second quantity, output the first read control signal when the first quantity is greater than the second quantity, and output the second read control signal when the first quantity is less than the second quantity.

Alternatively, the counting circuit is configured to collect statistics on a first quantity of pieces of first data in the data that needs to be written into the target SRAM unit, and the comparison circuit is configured to: compare the first quantity with $$\frac{L}{2},$$

where L is a total quantity of pieces of data that needs to be written into the target SRAM unit (when a data bit width of the SRAM and a quantity of included SRAM units are fixed, the total quantity of pieces of data that needs to be written into the target SRAM unit is known), output the first read control signal when the first quantity is greater than $$\frac{L}{2},$$

and output the second read control signal when the first quantity is less than $$\frac{L}{2}.$$

Alternatively, the counting circuit is configured to collect statistics on a second quantity of pieces of second data in the data that needs to be written into the target SRAM unit, and the comparison circuit is configured to: compare the second quantity with $$\frac{L}{2},$$

output the first read control signal when the second quantity is less than $$\frac{L}{2},$$

and output the second read control signal when the second quantity is greater than $$\frac{L}{2}.$$

Further, the read control signal storage circuit is a latch.

In a possible implementation, the data statistics collection circuit is further configured to generate the first read control signal or the second read control signal when the first quantity is equal to the second quantity.

In a possible implementation, the SRAM memory further includes M×N read control circuits, and each of the M×N read control circuits is connected to one column of SRAM units in the SRAM storage array through a corresponding read bit line.

The read control circuit is configured to: after the SRAM memory receives a read command and before the read enabling signal of a column of SRAM units connected to a read control circuit is valid, under control of the first read control signal and a phase-inverted signal of a precharge signal, charge, to a high level, a read bit line corresponding to the column of SRAM units connected to the read control circuit. Alternatively, the read control circuit is configured to: after the SRAM memory receives a read command and before the read enabling signal of a column of SRAM units connected to the read control circuit is valid, under control of the second read control signal and a precharge signal, discharge, to a low level, a read bit line corresponding to the column of SRAM units connected to the read control circuit.

In a possible implementation, the read control circuit includes a fifth pull-up transistor, a fifth pull-down transistor, a first either-or switch, and a second either-or switch.

A source of the fifth pull-up transistor is connected to a power supply, a gate of the fifth pull-up transistor is connected to an output end of the first either-or switch, and a drain of the fifth pull-up transistor is connected to one end of the read bit line corresponding to the column of SRAM units that are connected to the read control circuit and that are in the SRAM storage array. A first input end of the first either-or switch is connected to the power supply, a second input end of the first either-or switch is configured to input the phase-inverted signal of the precharge signal, and a control end of the first either-or switch is configured to input the first read control signal or the second read control signal. A drain of the fifth pull-down transistor is connected to the other end of the read bit line corresponding to the column of SRAM units that are connected to the read control circuit and that are in the SRAM storage array, a gate of the fifth pull-down transistor is connected to an output end of the second either-or switch, and a source of the fifth pull-down transistor is grounded. A first input end of the second either-or switch is configured to input the precharge signal, a second input end of the second either-or switch is grounded, and a control end of the second either-or switch is configured to input the first read control signal or the second read control signal.

When the first read control signal is input into the control end of the first either-or switch and the control end of the second either-or switch, and the phase-inverted signal of the precharge signal is valid, the output end of the first either-or switch is connected to the first input end of the first either-or switch, the fifth pull-up transistor is in an on state, the output end of the second either-or switch is connected to the first input end of the second either-or switch, and the fifth pull-down transistor is in an off state. When the second read control signal is input into the control end of the first either-or switch and the control end of the second either-or switch, and the precharge signal is valid, the output end of the first either-or switch is connected to the second input end of the first either-or switch, the fifth pull-up transistor is in an off state, the output end of the second either-or switch is connected to the second input end of the second either-or switch, and the fifth pull-down transistor is in an on state.

Further, the fifth pull-up transistor is a P-channel field-effect transistor, and the fifth pull-down transistor is an N-channel field-effect transistor.

According to a third aspect, this application further provides a processing circuit chip, where the processing circuit chip includes any SRAM memory according to the second aspect and one or more processing circuits, and the SRAM memory is configured to store data required when the one or more processing circuits run.

In the foregoing solution, an SRAM processor included in the processing circuit chip can adjust a working structure of each column of SRAM units in the SRAM processor based on quantities of pieces of first data and second data stored in each column of SRAM units in the SRAM memory, to avoid as much as possible that charging a read bit line connected to the SRAM unit consumes energy during a read operation on the SRAM unit, to reduce power consumption of the SRAM memory, thereby improving performance (for example, a processing speed) of the processing circuit chip.

According to a fourth aspect, this application further provides an electronic device, where the electronic device includes a power supply and the processing circuit chip according to the third aspect, and the power supply is configured to supply power to the processing circuit chip.

DESCRIPTION OF EMBODIMENTS

With development of artificial intelligence, related machine learning (ML) algorithms and theories are widely applied to various fields, and have achieved surprising effects. Among many machine learning algorithms, a neural network algorithm imitates a behavioral feature of a biological neural system to process original information and extract a multidimensional feature, and has attracted widespread attention in the pattern recognition field. A convolutional neural network (CNN) has a prominent advantage in the classification and recognition field. For example, a ResNet deep convolutional neural network proposed by Szegedy and so on has an error rate of only 3.57% in a same data set. This has far exceeded an average recognition level of human beings.

To obtain a high-performance mapping relationship through fitting, a neural network usually has an extremely large network scale and a large quantity of calculations are performed. As a network depth increases in recent years, parameters and calculations involved in the neural network also multiply, so that energy consumption for accessing an SRAM becomes a bottleneck of a CNN processor. Although energy consumed by a single write operation is greater than energy consumed by a single read operation, in a CNN scenario, a quantity of write operations performed on the SRAM is far less than a quantity of read operations performed on the SRAM. A first-layer convolution layer of a visual geometric group (VGG) 16 is used as an example. A quantity of write operations performed on the SRAM is 150000, but a quantity of read operations performed on the SRAM is 8500000, and up to 70% of energy is consumed in a process of charging and discharging a bit line of the SRAM.

Currently, there are mainly two methods for reducing power consumption of the SRAM in a data access process: One method is to reduce a scale of a neural network in an aspect of algorithm, to reduce data access and operation costs. However, compression in the aspect of algorithm directly causes performance deterioration of the neural network. The other method is to reduce energy consumption of data access in an aspect of hardware, to reduce communication with an SRAM in an operation process. However, this improvement in hardware is strongly related to an algorithm of the neural network. A size of a CNN convolution kernel, a quantity of network layers, and a quantity of neurons at each layer all correspond to different circuit mapping structures, and this has relatively poor generality.

To resolve the foregoing problem that power consumption of an SRAM is relatively high when the SRAM is accessed, this application provides an SRAM unit, an SRAM memory, a processing circuit chip, and an electronic device.

Figure 1:
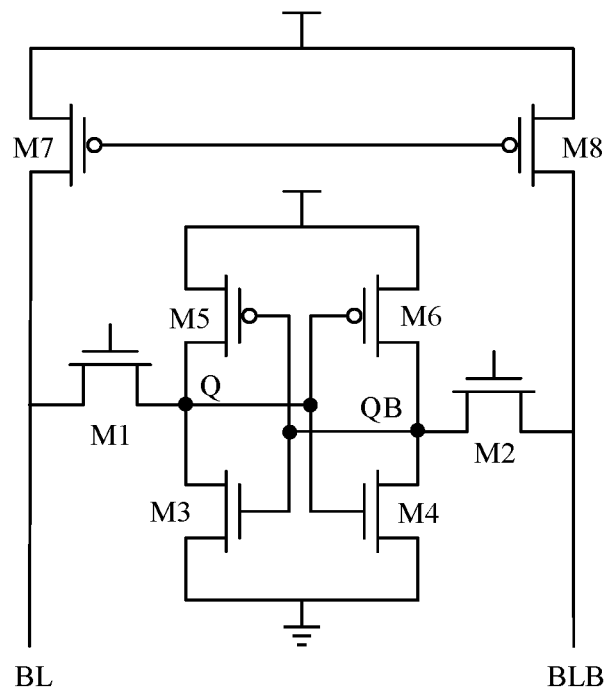
FIG. 1 is a schematic structural diagram of a 6T-SRAM unit in the prior art.
Figure 2:
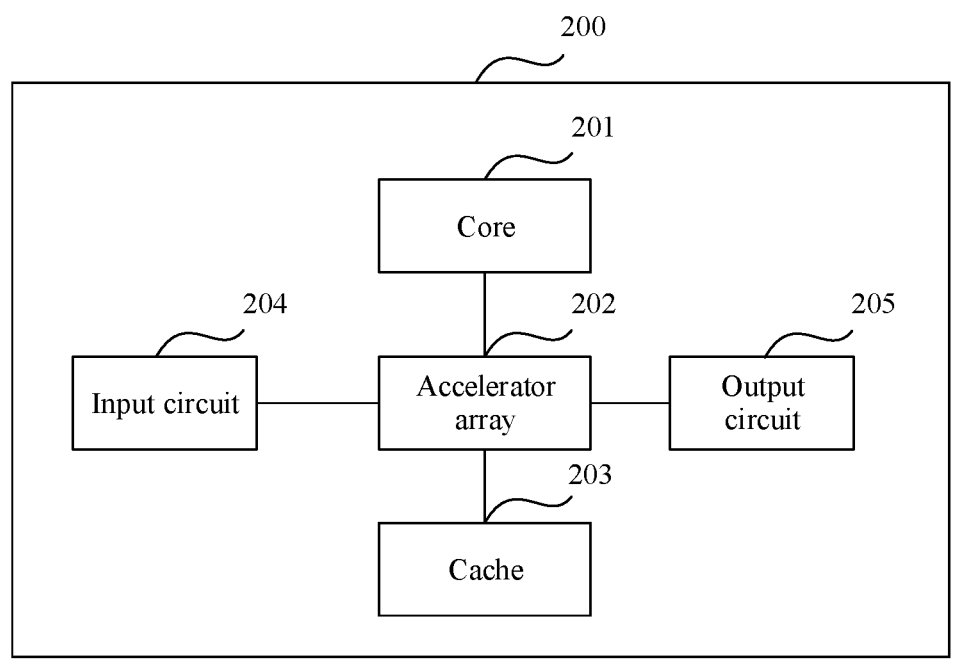
FIG. 2 is a schematic structural diagram of a system on chip applied to a neural network according to an embodiment of this application.

Technical solutions provided in the embodiments of this application are applicable to a scenario in which an SRAM memory is accessed to read data or store data, for example, an SRAM is accessed in a calculation process of a neural network. A system on chip (SoC) applied to a neural network shown in FIG. 2 is used as an example. The SoC includes a core 201, an accelerator array 202, a cache 203, an input circuit 204, and an output circuit 205. The core 201 is responsible for global task scheduling and management in a running process of the neural network. The accelerator array 202 is responsible for performing large-scale neural network calculation based on scheduling by the core 201. The cache 203 is responsible for temporarily storing data required for neural network calculation, and is implemented by using an SRAM. The input circuit 204 is configured to obtain to-be-processed data from outside. The output circuit 205 is configured to output a calculation result obtained by the accelerator array 202 to another external unit, for example, an external memory.

In the following, some terms of the embodiments of this application are described, to help persons skilled in the art have a better understanding.

(1) Logical level: A high voltage and a low voltage in a digital circuit are represented by a logical level, including a high level and a low level. The high level is represented by "1" and the low level is represented by "0". In digital circuits including different components, voltages also correspond to different logical levels.

(2) Pull up means that a signal is clamped to a high level. Pull down means that a signal is clamped to a low level.

(3) A transistor is a semiconductor device that can control an output current based on an input voltage, and includes a bipolar junction transistor (BJT) and a field-effect transistor (FET).

(4) Word line: Each storage unit in a storage array and another unit share an electrical connection in a row and a column. A horizontal connecting line is referred to as a "word line", and vertical connecting lines through which data flows into and out of a storage unit are referred to as "bit lines".

(5) "A plurality of" refers to two or more than two.

In addition, it should be understood that in descriptions of this application, terms such as "first" and "second" are merely used for distinguishing descriptions, and cannot be understood as an indication or implication of relative importance, or an indication or implication of a sequence.

The following describes the embodiments of this application in detail with reference to the accompanying drawings in this specification. It should be noted that a sequence of presenting the embodiments of this application merely represents a sequence of the embodiments, and does not represent preference of technical solutions provided in the embodiments.

Figure 3:
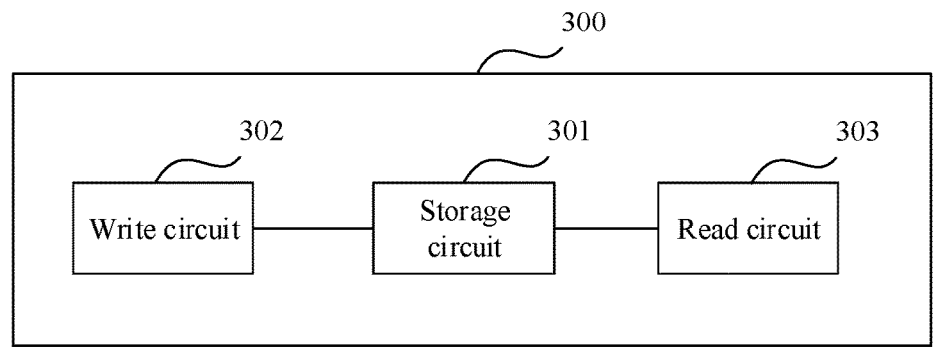
FIG. 3 is a schematic structural diagram of an SRAM unit according to an embodiment of this application.

An embodiment of this application provides an SRAM unit, where the SRAM unit is located in an SRAM memory, and the SRAM memory includes an SRAM storage array including a plurality of SRAM units. The SRAM memory can read, by using a corresponding solution and based on a feature of data stored in each column of SRAM units in the SRAM storage array, data stored in the SRAM unit, to reduce power consumption of the SRAM memory in a data read process. As shown in FIG. 3, the SRAM unit 300 includes: a storage circuit 301, a write circuit 302, and a read circuit 303.

The storage circuit 301 is connected to each of the write circuit 302 and the read circuit 303, and is configured to store data, where the data is first data or second data, the first data is represented by a high level, and the second data is represented by a low level.

The write circuit 302 is further connected to a write word line and a write bit line, and is configured to write data into the storage circuit 301.

The read circuit 303 is further connected to a read enabling signal end and a read bit line. When a first quantity of SRAM units that store the first data and that are in a column of the SRAM unit 300 in the SRAM storage array is greater than a second quantity of SRAM units that store the second data and that are in the column, the read bit line is charged to a high level after the SRAM memory receives a read command and before a read enabling signal at the read enabling signal end is valid. When the first quantity is less than the second quantity, the read bit line is discharged to a low level after the SRAM memory receives the read command and before the read enabling signal is valid. The read circuit 303 is configured to: after the read enabling signal is valid, enable data on the read bit line to be the data stored in the storage circuit 301.

In a possible implementation, when the first quantity is equal to the second quantity, the read bit line is charged to a high level or discharged to a low level after the SRAM memory receives the read command and before the read enabling signal is valid.

Figure 4A:
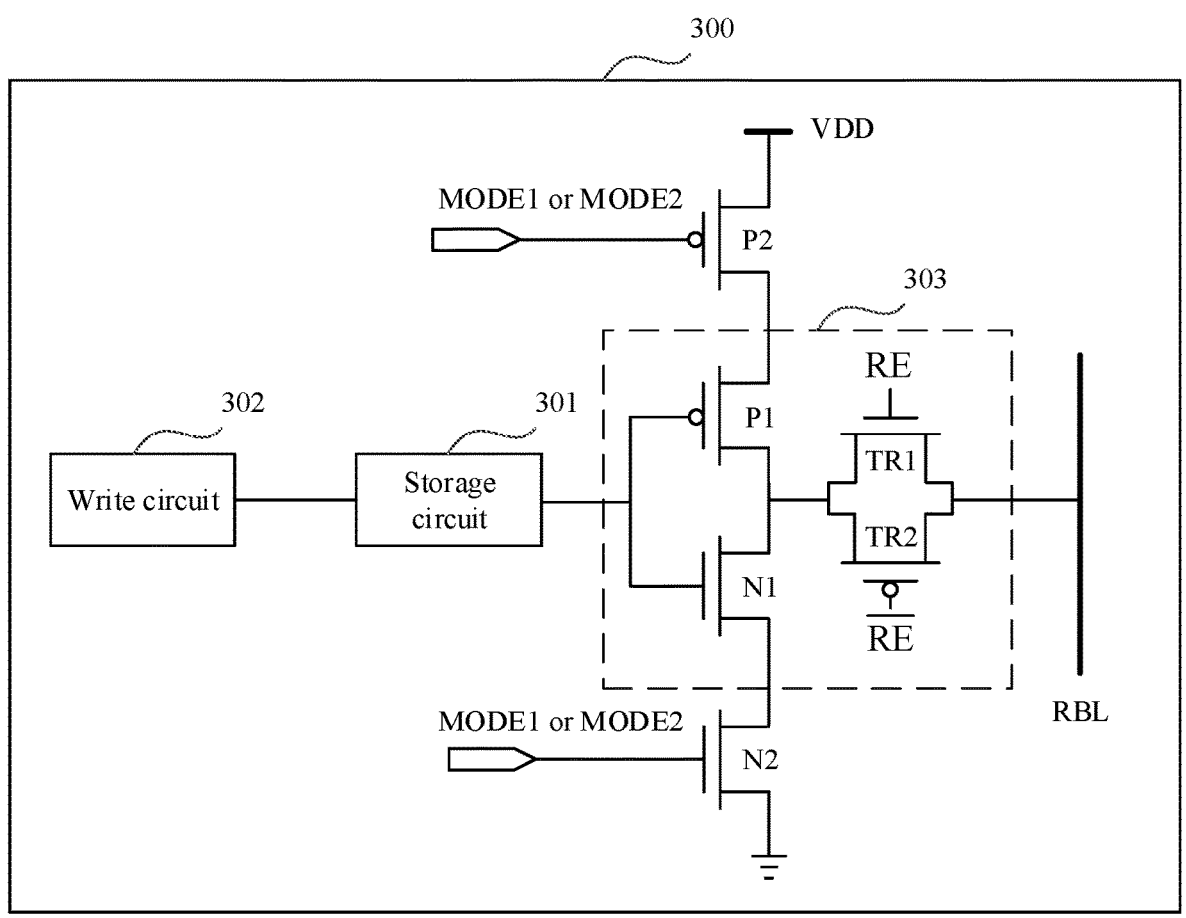
FIG. 4a is a schematic structural diagram of a read circuit of an SRAM unit according to an embodiment of this application.

In a possible implementation, the read circuit 303 includes a first pull-up transistor P1, a first pull-down transistor N1, a first read transmission transistor TR1, and a second read transmission transistor TR2, as shown in FIG. 4a.

A gate of the first pull-up transistor P1 is connected to each of a gate of the first pull-down transistor N1 and the storage circuit 301, a source of the first pull-up transistor P1 is connected to a drain of a second pull-up transistor P2, and a drain of the first pull-up transistor P1 is connected to each of a drain of the first pull-down transistor N1, a source of the first read transmission transistor TR1, and a drain of the second read transmission transistor TR2. A source of the first pull-down transistor N1 is connected to a drain of a second pull-down transistor N2, a source of the second pull-down transistor N2 is grounded, and a source of the second pull-up transistor P2 is connected to a power supply. A gate of the second pull-up transistor P2 and a gate of the second pull-down transistor N2 are used to receive a first read control signal MODE1 or the second read control signal MODE2. A drain of the first read transmission transistor TR1 is connected to each of a source of the second read transmission transistor TR2 and the read bit line RBL, a gate of the first read transmission transistor TR1 is connected to a first read enabling signal end, and a gate of the second read transmission transistor TR2 is connected to a second read enabling signal end. The read enabling signal end includes the first read enabling signal end and the second read enabling signal end.

When the gate of the second pull-up transistor P2 and the gate of the second pull-down transistor N2 receive the first read control signal MODE1, the second pull-up transistor P2 is in an off state, and the second pull-down transistor N2 is in an on state. When the gate of the second pull-up transistor P2 and the gate of the second pull-down transistor N2 receive the second read control signal MODE2, the second pull-up transistor P2 is in the on state, and the second pull-down transistor N2 is in the off state. When the first read enabling signal RE at the first read enabling signal end is valid, and the second read enabling signal $\overline{\text{RE}}$ at the second read enabling signal end is valid, both the first read transmission transistor TR1 and the second read transmission transistor TR2 are in the on state. The read enabling signal includes the first read enabling signal RE and the second read enabling signal $\overline{\text{RE}}$, and the second read enabling signal $\overline{\text{RE}}$ is a phase-inverted signal of the first read enabling signal RE.

It should be noted that the first read control signal MODE1 and the second read control signal MODE2 are at two different levels of a read control signal MODE inputted from a same read control signal end, that is, the first read control signal end and the second read control signal end are a same signal input end. The first read enabling signal RE and the second read enabling signal $\overline{\text{RE}}$ are two signals, and the second read enabling signal $\overline{\text{RE}}$ is a phase-inverted signal of the first read enabling signal.

Further, the first pull-up transistor P1, the second pull-up transistor P2, and the first read transmission transistor TR1 are P-channel field-effect transistors. The first pull-down transistor N1, the second pull-down transistor N2, and the second read transmission transistor TR2 are N-channel field-effect transistors. Generally, P-channel metal-oxide-semiconductor field-effect transistors (MOSFET), that is, PMOS transistors, are used as the first pull-up transistor P1, the second pull-up transistor P2, and the first read transmission transistor TR1, and NMOS transistors are used as the first pull-down transistor N1, the second pull-down transistor N2, and the second read transmission transistor TR2.

Figure 4B:
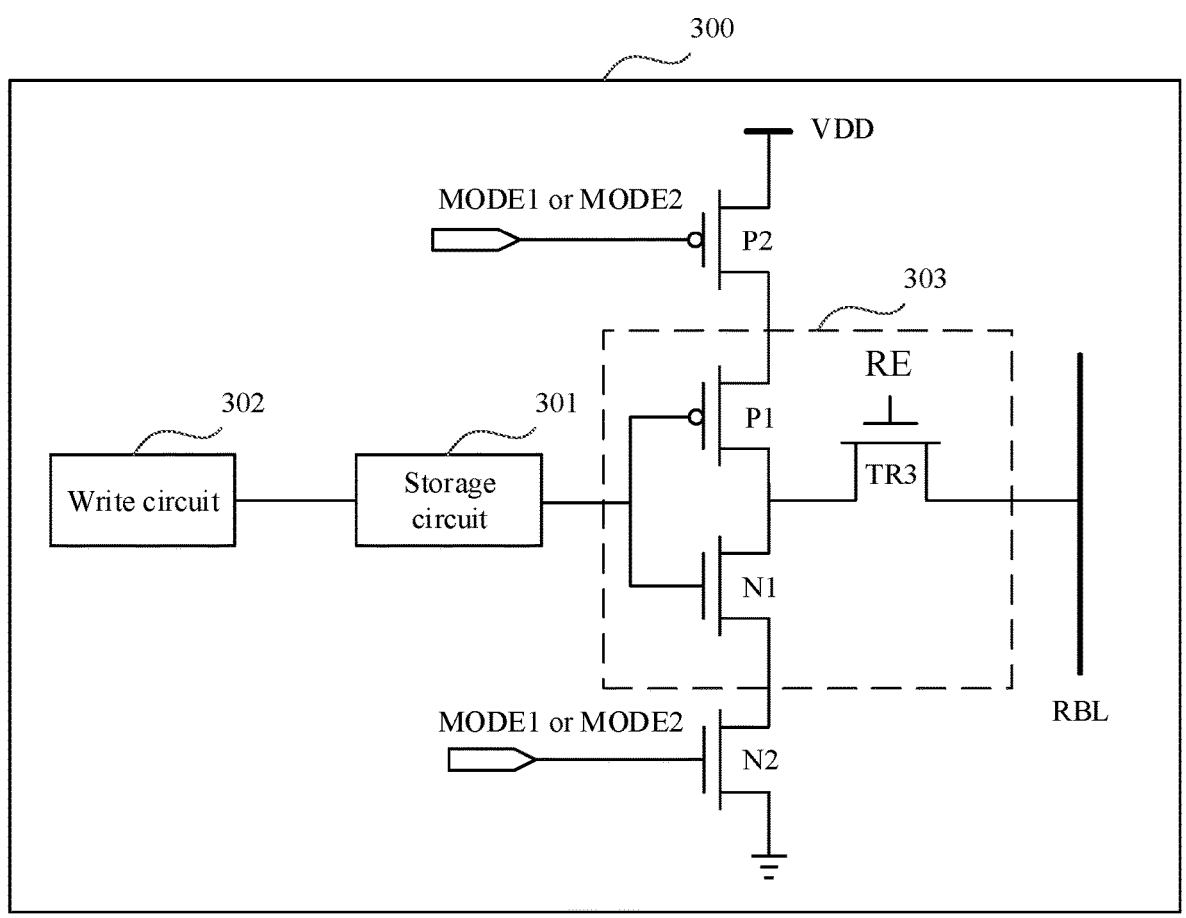
FIG. 4b is a schematic structural diagram of a read circuit of another SRAM unit according to an embodiment of this application.

In another possible implementation, functions of the first read transmission transistor TR1 and the second read transmission transistor TR2 may also be implemented by a third read transmission transistor TR3, as shown in FIG. 4b. The gate of the first pull-up transistor P1 is connected to each of the gate of the first pull-down transistor N1 and the storage circuit 301, the source of the first pull-up transistor P1 is connected to the drain of the second pull-up transistor P2, and the drain of the first pull-up transistor P1 is connected to each of the drain of the first pull-down transistor N1 and a source of the third read transmission transistor TR3. The source of the first pull-down transistor N1 is connected to the drain of the second pull-down transistor N2, the source of the second pull-down transistor N2 is grounded, and the source of the second pull-up transistor P2 is connected to a power supply. The gate of the second pull-up transistor P2 and the gate of the second pull-down transistor N2 are used to receive the first read control signal MODE1 or the second read control signal MODE2.

When the gate of the second pull-up transistor P2 and the gate of the second pull-down transistor N2 receive the first read control signal MODE1, the second pull-up transistor P2 is in the off state, and the second pull-down transistor N2 is in the on state. When the gate of the second pull-up transistor P2 and the gate of the second pull-down transistor N2 receive the second read control signal MODE2, the second pull-up transistor P2 is in the on state, and the second pull-down transistor N2 is in the off state.

A drain of the third read transmission transistor TR3 is connected to the read bit line RBL, and a gate of the third read transmission transistor TR3 is connected to the read enabling signal end. When the read enabling signal at the read enabling signal end is valid, the third read transmission transistor TR3 is in the on state.

Further, the third read transmission transistor TR3 may be a P-channel transistor, or may be an N-channel transistor.

Figure 5:
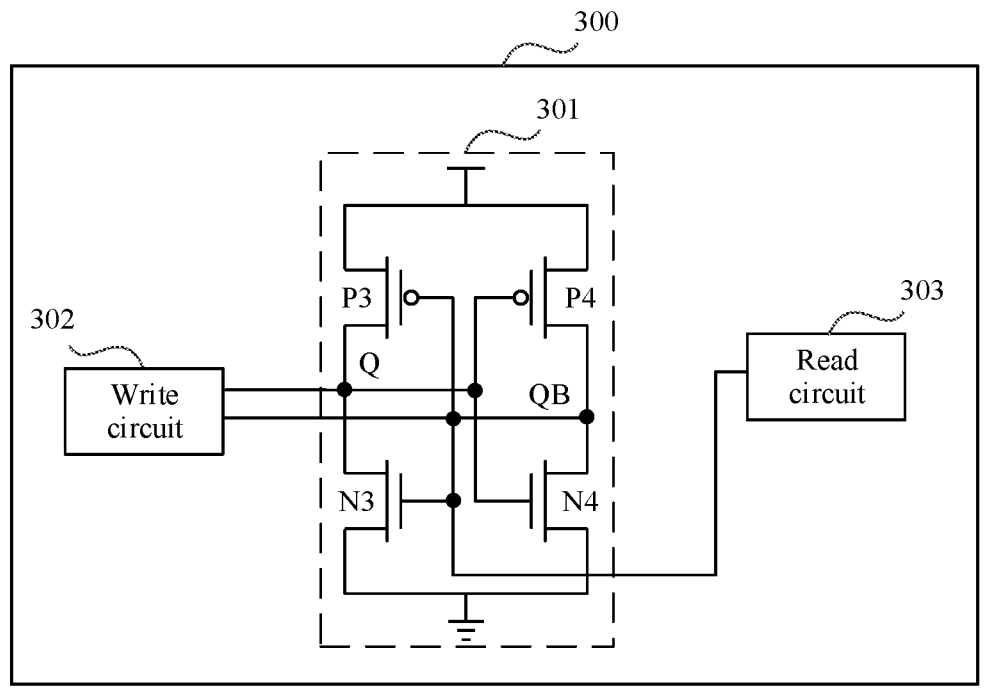
FIG. 5 is a schematic structural diagram of a storage circuit of an SRAM unit according to an embodiment of this application.

In a possible implementation, the storage unit 301 includes a third pull-up transistor P3, a fourth pull-up transistor P4, a third pull-down transistor N3, and a fourth pull-down transistor N4, as shown in FIG. 5.

Both a source of the third pull-up transistor P3 and a source of the fourth pull-up transistor P4 are connected to a power supply. A gate of the third pull-up transistor P3 is connected to each of a gate of the third pull-down transistor N3, a drain of the fourth pull-up transistor P4, a drain of the fourth pull-down transistor N4, the read circuit 303, and the write circuit 302. A gate of the fourth pull-up transistor P4 is connected to each of a gate of the fourth pull-down transistor N4, a drain of the third pull-up transistor P3, a drain of the third pull-down transistor N3, and the write circuit 302. Both a source of the third pull-down transistor N3 and a source of the fourth pull-down transistor N4 are grounded. That is, the third pull-up transistor P3, the fourth pull-up transistor P4, the third pull-down transistor N3, and the fourth pull-down transistor N4 form two cross-coupled phase inverters.

Further, the third pull-up transistor P3 and the fourth pull-up transistor P4 are P-channel field-effect transistors. The third pull-down transistor N3 and the fourth pull-down transistor N4 are N-channel field-effect transistors. Generally, PMOS transistors are used as the third pull-up transistor P3 and the fourth pull-up transistor P4, and NMOS transistors are used as the third pull-down transistor N3 and the fourth pull-down transistor N4.

Figure 6:
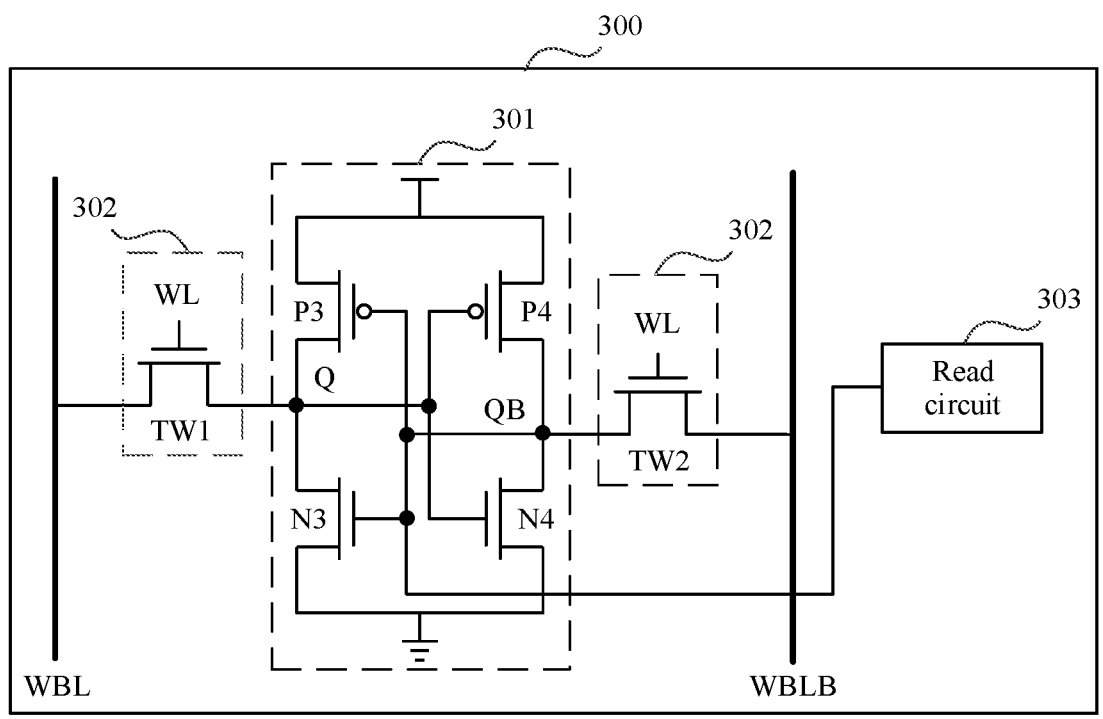
FIG. 6 is a schematic structural diagram of a write circuit of an SRAM unit according to an embodiment of this application.

In a possible implementation, when the storage circuit 301 has the structure shown in FIG. 5, the write circuit 302 includes a first write transmission transistor TW1 and a second write transmission transistor TW2, as shown in FIG. 6. A source of the first write transmission transistor TW1 is connected to a first write bit line WBL, a gate of the first write transmission transistor TW1 is connected to a write word line WL, and a drain of the first write transmission transistor TW1 is connected to each of the drain of the third pull-up transistor P3 and the gate of the fourth pull-up transistor P4. A source of the second write transmission transistor TW2 is connected to each of the drain of the fourth pull-up transistor P4 and the gate of the third pull-up transistor P3, a drain of the second write transmission transistor TW2 is connected to a second write bit line WBLB, a gate of the second write transmission transistor TW2 is connected to the write word line WL, and the drain of the second write transmission transistor TW2 is connected to each of the source of the fourth pull-up transistor N4 and the gate of the third pull-up transistor P3. The write bit line includes the first write bit line and the second write bit line. When the write circuit 302 writes data into the storage circuit 301, both the first write transmission transistor TW1 and the second write transmission transistor TW2 are in the on state, and the first write bit line and the second write bit line have inverted phases.

Further, both the first write transmission transistor TW1 and the second write transmission transistor TW2 are N-channel field-effect transistors. Generally, NMOS transistors are used as both the first write transmission transistor TW1 and the second write transmission transistor TW2.

Figure 7A:
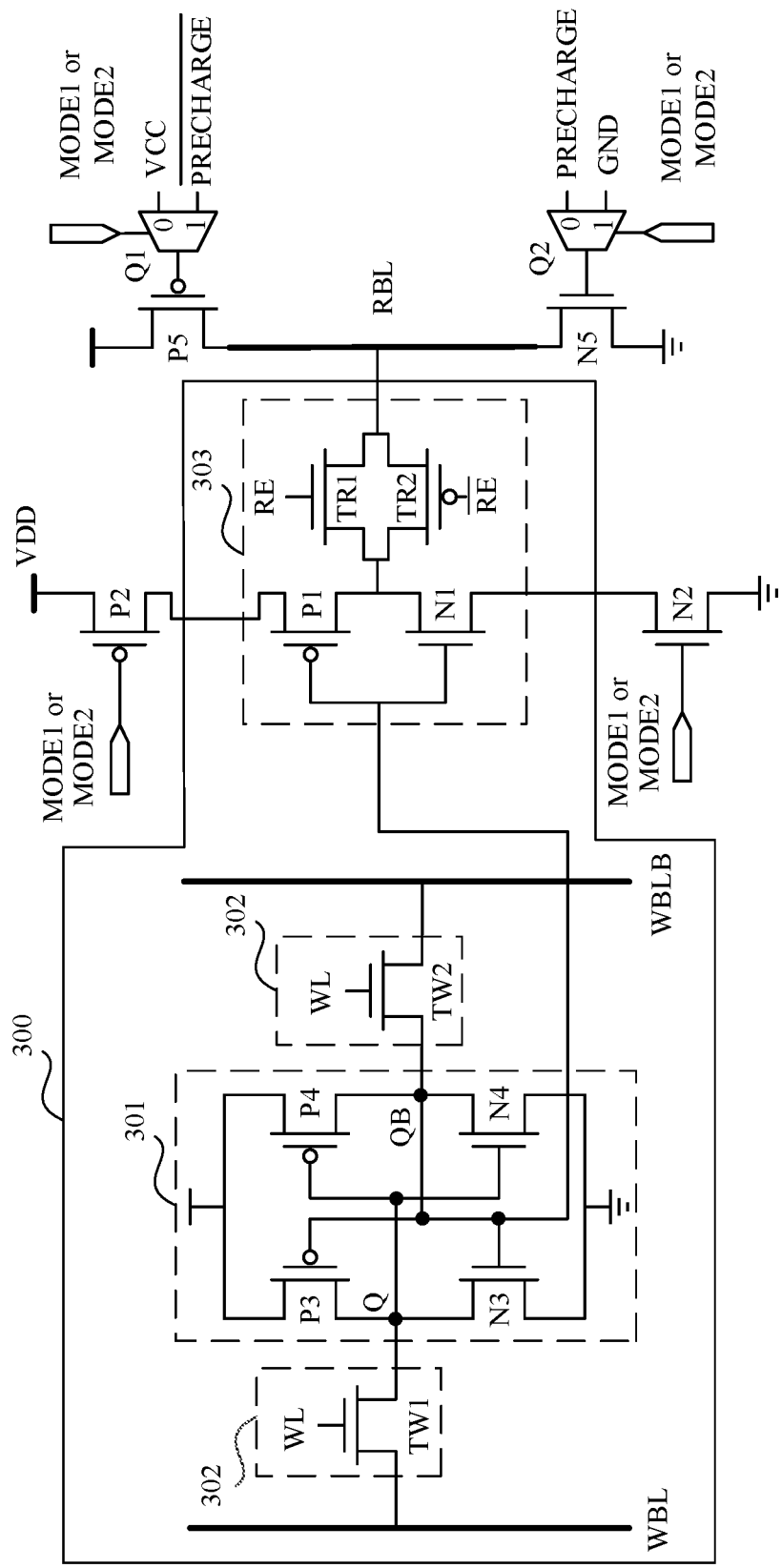
FIG. 7a is a schematic diagram of a circuit structure for charging and discharging a read bit line in an SRAM unit according to an embodiment of this application.

In a possible implementation, the SRAM unit 300 may charge and discharge the read bit line RBL by using a fifth pull-up transistor P5, a fifth pull-down transistor N5, a first either-or switch Q1, and a second either-or switch Q2. As shown in FIG. 7a, a source of the fifth pull-up transistor P5 is connected to a power supply, a gate of the fifth pull-up transistor P5 is connected to an output end of the first either-or switch Q1, and a drain of the fifth pull-up transistor P5 is connected to one end of the read bit line corresponding to a column of SRAM units that are connected to the read control circuit 804 and that are in the SRAM storage array. A first input end of the first either-or switch Q1 is connected to a power supply VCC, a second input end of the first either-or switch Q1 is configured to input the phase-inverted signal $\overline{PRECHARGE}$ of the precharge signal, and a control end of the first either-or switch is configured to input the first read control signal MODE1 or the second read control signal MODE2. A drain of the fifth pull-down transistor N5 is connected to the read bit line RBL, a gate of the fifth pull-down transistor N5 is connected to an output end of the second either-or switch Q2, and a source of the fifth pull-down transistor N5 is grounded. A first input end of the second either-or switch Q2 is configured to input the precharge signal PRECHARGE, a second input end of the second either-or switch Q2 is grounded, and a control end of the second either-or switch Q2 is configured to input the first read control signal MODE1 or the second read control signal MODE2.

When the first read control signal MODE1 is input into the control end of the first either-or switch Q1 and the control end of the second either-or switch Q2 and the phase-inverted signal $\overline{PRECHARGE}$ of the precharge signal is valid, the output end of the first either-or switch Q1 is connected to the first input end of the first either-or switch Q1, the fifth pull-up transistor P5 is in the on state, the output end of the second either-or switch Q2 is connected to the first input end of the second either-or switch Q2, and the fifth pull-down transistor N5 is in the off state. When the second read control signal MODE2 is input into the control end of the first either-or switch Q1 and the control end of the second either-or switch Q2 and the precharge signal PRECHARGE is valid, the output end of the first either-or switch Q1 is connected to the second input end of the first either-or switch Q1, the fifth pull-up transistor P5 is in the off state, the output end of the second either-or switch Q2 is connected to the second input end of the second either-or switch Q2, and the fifth pull-down transistor N5 is in the on state.

Further, the fifth pull-up transistor is a P-channel field-effect transistor, and the fifth pull-down transistor is an N-channel field-effect transistor. In this case, the precharge signal PRECHARGE is active high. When the first read control signal MODE1 is input into the control end of the first either-or switch Q1 and the control end of the second either-or switch Q2, after the phase-inverted signal $\overline{PRECHARGE}$ of the precharge signal PRECHARGE is valid and before the read enabling signal is valid, the precharge signal PRECHARGE is at a high level, and the phase-inverted signal $\overline{PRECHARGE}$ of the precharge signal PRECHARGE signal is at a low level. The phase-inverted signal $\overline{PRECHARGE}$ of the precharge signal PRECHARGE signal and the first read control signal MODE1 enable the fifth pull-up transistor P5 to be turned on, the precharge signal PRECHARGE signal and the first read control signal MODE1 enable the fifth pull-down transistor N5 to be turned off, and the read bit line RBL is charged to a high level. After charging of the read bit line RBL is completed, the precharge signal PRECHARGE signal changes from a high level to a low level, so that the fifth pull-up transistor P5 is turned off. When the second read control signal MODE2 is input into the control end of the first either-or switch Q1 and the control end of the second either-or switch Q2, after the precharge signal PRECHARGE is valid and before the read enabling signal is valid, the precharge signal PRECHARGE signal is at a high level, and the phase-inverted signal $\overline{PRECHARGE}$ of the precharge signal PRECHARGE signal is at a low level. The phase-inverted signal $\overline{PRECHARGE}$ of the precharge signal PRECHARGE signal and the second read control signal MODE2 enable the fifth pull-up transistor P5 to be turned off and enable the fifth pull-down transistor N5 to be turned on, and the read bit line RBL is discharged to a low level. After discharging of the read bit line RBL is completed, the precharge signal PRECHARGE signal changes from a high level to a low level, so that the fifth pull-down transistor N5 is turned off.

In the following, the read circuit 303 has the structure shown in FIG. 4a, the storage unit 301 has the structure shown in FIG. 5, the write circuit 302 has the structure shown in FIG. 6, and precharging and pre-discharging of the read bit line RBL are implemented by using the fifth pull-up transistor P5, the fifth pull-down transistor N5, the first either-or switch Q1, and the second either-or switch Q2 in FIG. 7a, that is, the SRAM unit 300 has a structure shown in FIG. 7b. In this case, a working principle of the SRAM unit 300 is described in detail.

When the quantity of the SRAM units that store the first data and that are in the column of the SRAM unit 300 in the SRAM storage array is greater than the quantity of the SRAM units that store the second data and that are in the column, the first read control signal MODE1 represented by a high level is input into the gate of the second pull-up transistor P2 and the gate of the second pull-down transistor N2. To be specific, when MODE1=1, the SRAM unit 300 is configured in a precharging mode, the second pull-up transistor P2 is in the off state, and the second pull-down transistor N2 is in the on state. After the precharge signal PRECHARGE is valid, before the first read enabling signal RE and the second read enabling signal $\overline{RE}$ are valid, the fifth pull-up transistor P5 is in the on state, the fifth pull-down transistor N4 is in the off state, and the read bit line RBL is charged to a high level. When the first read enabling signal RE and the second read enabling signal $\overline{RE}$ are valid, that is, when a read operation is performed on the SRAM unit 300, the first read enabling signal RE is at a high level and the second read enabling signal $\overline{RE}$ is at a low level, and the first read transmission transistor TR1 and the second read transmission transistor TR2 are turned on. If data stored in a node Q in the storage circuit 301 is Q=0 and data stored in a node QB is QB=1, the first pull-down transistor N1 is turned on and the read bit line RBL is discharged to a low level, indicating that "0" is read. As a result, when the read circuit 303 reads next time the data stored in the storage circuit 301, charging the read bit line RBL needs to consume energy. If the data stored in the storage circuit 301 is Q=1 and QB=0, the first pull-down transistor N1 is turned off and the read bit line RBL maintains a high level, indicating that "1" is read. Therefore, when the read circuit 303 reads next time the data stored in the storage circuit 301, charging the read bit line RBL does not need to consume energy.

When the quantity of the SRAM units that store the first data and that are in the column of the SRAM unit 300 in the SRAM storage array is less than the quantity of the SRAM units that store the second data and that are in the column, the second read control signal MODE2 represented by a low level is input to the gate of the second pull-up transistor P2 and the gate of the second pull-down transistor N2. To be specific, when MODE2=0, the SRAM unit 300 is configured in a pre-discharging mode, the second pull-up transistor P2 is in the on state, and the second pull-down transistor N2 is in the off state. After the precharge signal PRECHARGE is valid, before the first read enabling signal RE and the second read enabling signal $\overline{RE}$ are valid, the fifth pull-up transistor P5 is in the off state, the fifth pull-down transistor N4 is in the on state, and the read bit line RBL is discharged to a low level. When the first read enabling signal RE and the second read enabling signal $\overline{RE}$ are valid, that is, when a read operation is performed on the SRAM unit 300, the first read enabling signal RE is at a high level and the second read enabling signal is at a low level, and the first read transmission transistor TR1 and the second read transmission transistor TR2 are turned on. If the data stored in the storage circuit 301 is Q=0 and QB=1, the first pull-up transistor P1 is turned off and the read bit line RBL maintains a low level, indicating that "0" is read. In this process, no energy is consumed. If the data stored in the storage circuit 301 is Q=1 and QB=0, the first pull-up transistor P1 is turned on and the read bit line RBL is charged to a high level, indicating that "1" is read. In this process, energy needs to be consumed.

As can be learned from the foregoing, when the quantity of the SRAM units that store the first data and that are in the column of the SRAM unit 300 is greater than the quantity of the SRAM units that store the second data and that are in the column, energy needs to be consumed when "0" is read from the SRAM unit 300, and no energy needs to be consumed when "1" is read from the SRAM unit 300. When the quantity of the SRAM units that store the first data and that are in the column of the SRAM unit 300 is less than the quantity of the SRAM units that store the second data and that are in the column, no energy needs to be consumed when "0" is read from the SRAM unit 300, and energy needs to be consumed when "1" is read from the SRAM unit 300.

When the SRAM unit 300 first writes the second data "0", then reads the second data "0", then writes the first data "1", and then reads the first data "1", a sequence diagram of working of the SRAM unit 300 is shown in FIG. 7c, where Q represents the data stored in the SRAM unit 300, and MODE represents a read control signal. When MODE is at a high level, MODE represents the first read control signal MODE1. When MODE is at a low level, MODE represents the second read control signal MODE2. As can be learned from FIG. 12, when MODE=1, that is, the first read control signal MODE1 is equal to 1, a level of the read bit line RBL corresponding to the SRAM unit is not inverted and no energy needs to be consumed when the SRAM unit 300 reads the first data "1" stored in the SRAM unit 300. When MODE=0, that is, when the second read control signal MODE2 is equal to 0, the level of the read bit line RBL corresponding to the SRAM unit is not inverted and no energy needs to be consumed when the SRAM unit 300 reads the first data "0" stored in the SRAM unit 300.

In conclusion, in the foregoing solution, when the quantity of the SRAM units 300 that store the first data and that are in the column of the SRAM unit 300 is greater than the quantity of the SRAM units that store the second data and that are in the column, the read bit line connected to the SRAM unit 300 is precharged to a high level before the read circuit 303 reads the data stored in the storage circuit 301, so that when the read circuit 301 reads the first data next time, charging the read bit line RBL consumes no energy; and when the quantity of the SRAM units that store the first data and that are in the column of the SRAM unit 300 is less than the quantity of the SRAM units that store the second data and that are in the column, the read bit line is pre-discharged to a low level before the read circuit 303 reads the data stored in the storage circuit 301, so that when the read circuit 301 reads the second data next time, no energy is consumed. To be specific, the SRAM memory in which the SRAM unit 300 is located can adjust a working structure of the SRAM memory based on quantities of pieces of the first data and the second data stored in a column of SRAM units in the SRAM storage array, to avoid as much as possible that charging the read bit line connected to the SRAM unit 300 consumes energy during a read operation on the SRAM unit 300, thereby reducing power consumption of the SRAM memory. Especially, in a scenario in which a relatively large quantity of read operations are performed on the SRAM memory, for example, in a neural network scenario, power consumption of the SRAM memory can be significantly reduced.

Figure 8:
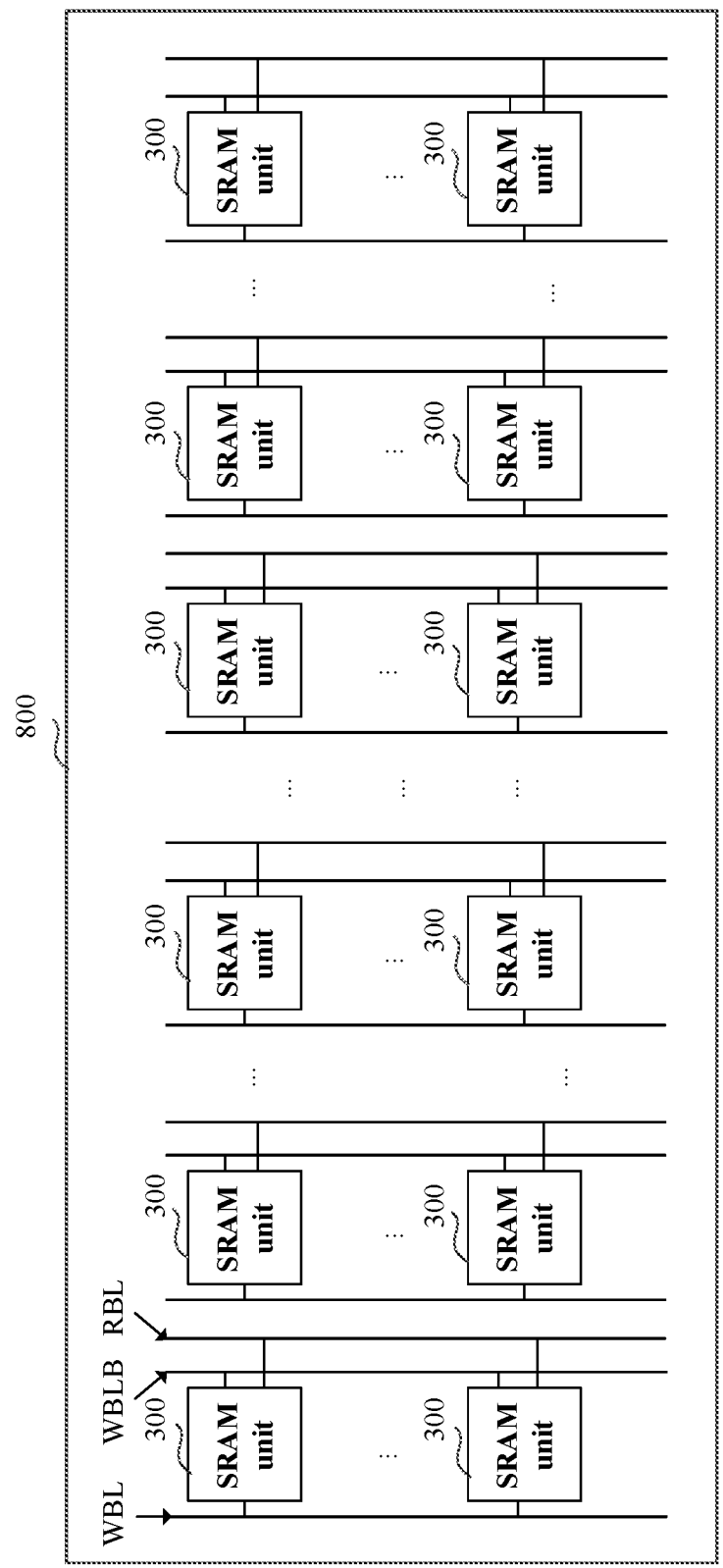
FIG. 8 is a schematic structural diagram of an SRAM according to an embodiment of this application.

Based on the foregoing embodiments, this application further provides an SRAM memory. The SRAM memory 800 includes a plurality of SRAM units 300, as shown in FIG. 8. The plurality of SRAM units 300 are connected through a plurality of write word lines, a plurality of write bit lines, and a plurality of read bit lines, to form an SRAM storage array.

In a possible implementation, each column of SRAM units in the SRAM storage array formed by the plurality of SRAM units 300 may share the second pull-up transistor P2 and the second pull-down transistor N2.

Figure 9:
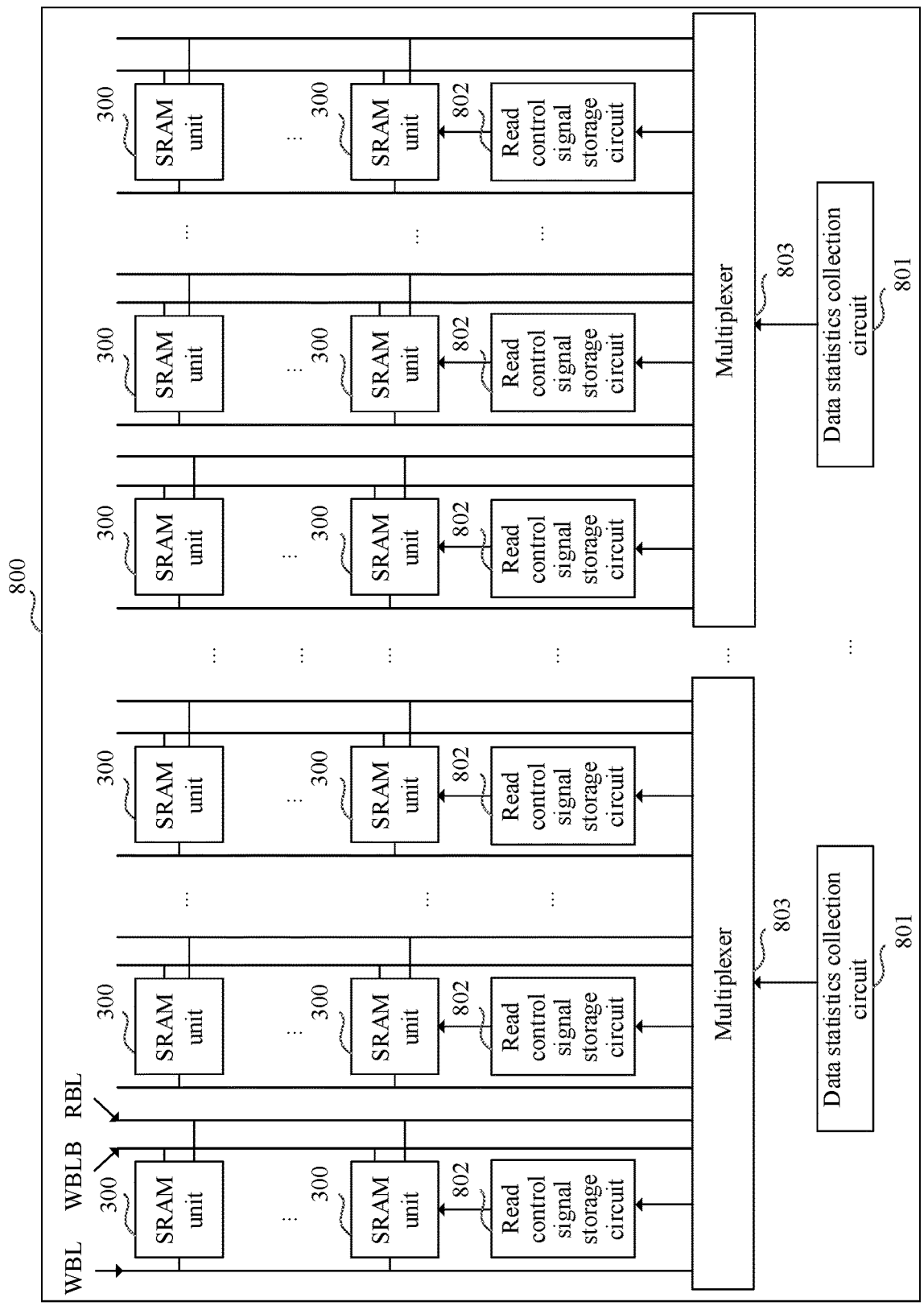
FIG. 9 is a schematic structural diagram of another SRAM according to an embodiment of this application.

In a possible implementation, the SRAM memory 800 further includes N data statistics collection circuits 801, M×N read control signal storage circuits 802, and N multiplexers 803, where N is equal to a data bit width of the SRAM memory 800. The N data statistics collection circuits 801 are in a one-to-one correspondence with the multiplexers 803, and the SRAM storage array includes M×N columns of SRAM units 300. Each of the N data statistics collection circuits 801 is connected to M of the read control signal storage circuits 802 through a corresponding multiplexer 803, and each of the M×N read control signal storage circuits 802 is connected to one column of SRAM units in the SRAM storage array, as shown in FIG. 9.

The data statistics collection circuit 801 is configured to: collect statistics on a quantity of pieces of first data and a quantity of pieces of second data in data that needs to be written into target SRAM unit, where the target SRAM unit is a column of SRAM units 300 that are connected to the data statistics collection circuit 801 and that are in the SRAM storage array; when the quantity of pieces of first data is greater than the quantity of pieces of second data, generate a first read control signal MODE1 used to control the read bit line to be charged to a high level, and when the quantity of pieces of first data is less than the quantity of pieces of second data, generate a second read control signal MODE2 used to control the read bit line to be discharged to a low level.

The read control signal storage circuit 802 connected to the target SRAM unit is configured to store the first read control signal MODE1 or the second read control signal MODE2, where the first read control signal is at a high level and the second read control signal is at a low level.

In another possible implementation, the SRAM memory 800 further includes: M×N data statistics collection circuits 801 and M×N read control signal storage circuits 802, where N is equal to a data bit width. Each bit of data corresponding to the data bit width corresponds to M columns in an SRAM storage array, and the SRAM storage array includes M×N columns of SRAM units 300. The M×N data statistics collection circuits 801 are in a one-to-one correspondence with the M×N columns of SRAM units 300, and each of the data statistics collection circuits 801 is connected to one column of SRAM units through one of the read control signal storage circuits 802.

The data statistics collection circuit 801 is configured to: collect statistics on a quantity of pieces of first data and a quantity of pieces of second data in data that needs to be written into a target SRAM unit, where the target SRAM unit is a column of SRAM units that are connected to the data statistics collection circuit and that are in the SRAM storage array; when the quantity of pieces of first data is greater than the quantity of pieces of second data, generate a first read control signal MODE1 used to control the read bit line to be charged to a high level, and when the quantity of pieces offirst data is less than the quantity of pieces of second data, generate a second read control signal MODE2 used to control the read bit line to be discharged to a low level.

The read control signal storage circuit 802 connected to the target SRAM unit is configured to store the first read control signal MODE1 or the second read control signal MODE2, where the first read control signal is at a high level and the second read control signal is at a low level.

The data statistics collection circuit 801 is further configured to generate the first read control signal MODE1 or the second read control signal MODE2 when the first quantity is equal to the second quantity.

Specifically, the N data statistics collection circuits 801 may select, based on a column address of the SRAM storage array through the multiplexer 803, a column that corresponds to the column address and that is in the SRAM storage array, and collect statistics on the quantity of pieces of first data and the quantity of pieces of second data in data that needs to be written into SRAM units in the column.

In a specific implementation, the data statistics collection circuit 801 includes a counting circuit and a comparison circuit. The counting circuit is configured to collect statistics on the first quantity of pieces of first data and the second quantity of pieces of second data in the data that needs to be written into the target SRAM unit. The comparison circuit is configured to: compare the first quantity with the second quantity, output the first read control signal MODE1 when the first quantity is greater than the second quantity, and output the second read control signal MODE2 when the first quantity is less than the second quantity.

Alternatively, the counting circuit is configured to: collect statistics on the first quantity of pieces of first data in the data that needs to be written into the target SRAM unit, and determine, based on the first quantity, the second quantity of pieces of second data in the data that needs to be written into the target SRAM unit; and the comparison circuit is configured to: compare the first quantity with $$\frac{L}{2},$$

where L is a total quantity of the data that needs to be written into the target SRAM unit (when a data bit width of the SRAM and a quantity of included SRAM units are fixed, the total quantity of the data that needs to be written into the target SRAM unit is known), output the first read control signal MODE1 when the first quantity is greater than $$\frac{L}{2},$$

and output the second read control signal MODE2 when the first quantity is less than $$\frac{L}{2}.$$

Alternatively, the counting circuit is configured to collect statistics on the second quantity of pieces of second data in the data that needs to be written into the target SRAM unit, and the comparison circuit is configured to: compare the second quantity with $$\frac{L}{2},$$

output the first read control signal MODE1 when the second quantity is less than the $$\frac{L}{2},$$

and output the second read control signal MODE2 when the second quantity is greater than $$\frac{L}{2}.$$

Figure 10:
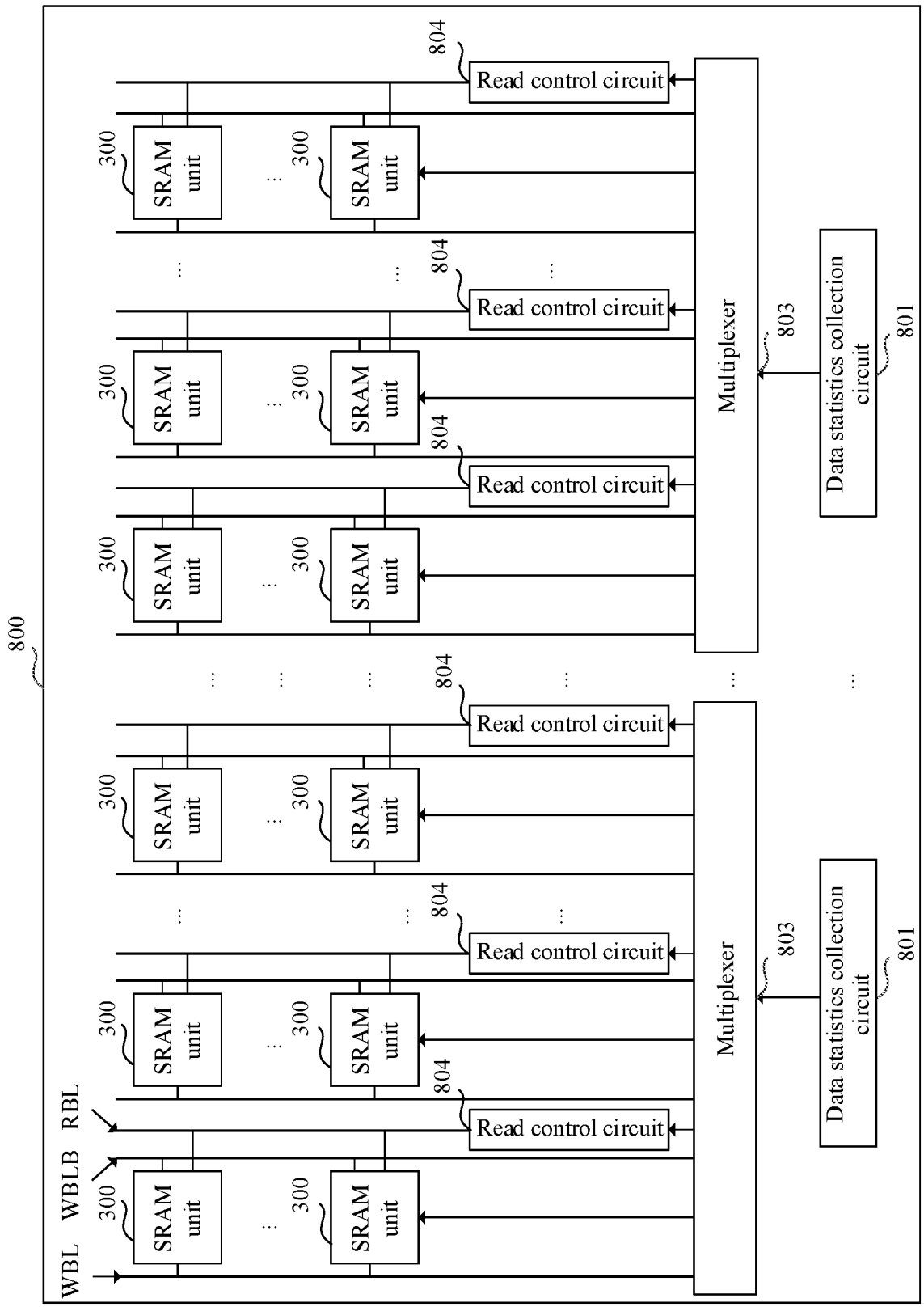
FIG. 10 is a schematic structural diagram of still another SRAM according to an embodiment of this application.

In a possible implementation, the SRAM 800 further includes M×N read control circuits 804, and each of the M×N read control circuits 804 is connected to one column of SRAM units 300 in the SRAM storage array through a corresponding read bit line, as shown in FIG. 10.

The read control circuit 804 is configured to: after the SRAM memory 800 receives a read command and before the read enabling signal of a column of SRAM units connected to a read control circuit 804 is valid, under control of the first read control signal MODE1 and a phase-inverted signal $\overline{\text{PRECHARGE}}$ of a precharge signal, charge a read bit line corresponding to the column of SRAM units connected to the read control circuit to a high level.

Alternatively, the read control circuit 804 is configured to: after the SRAM memory receives a read command and before the read enabling signal of a column of SRAM units connected to the read control circuit 804 is valid, under control of the second read control signal MODE2 and a precharge signal PRECHARGE, discharge a read bit line corresponding to the column of SRAM units connected to the read control circuit to a low level.

Figure 7B:
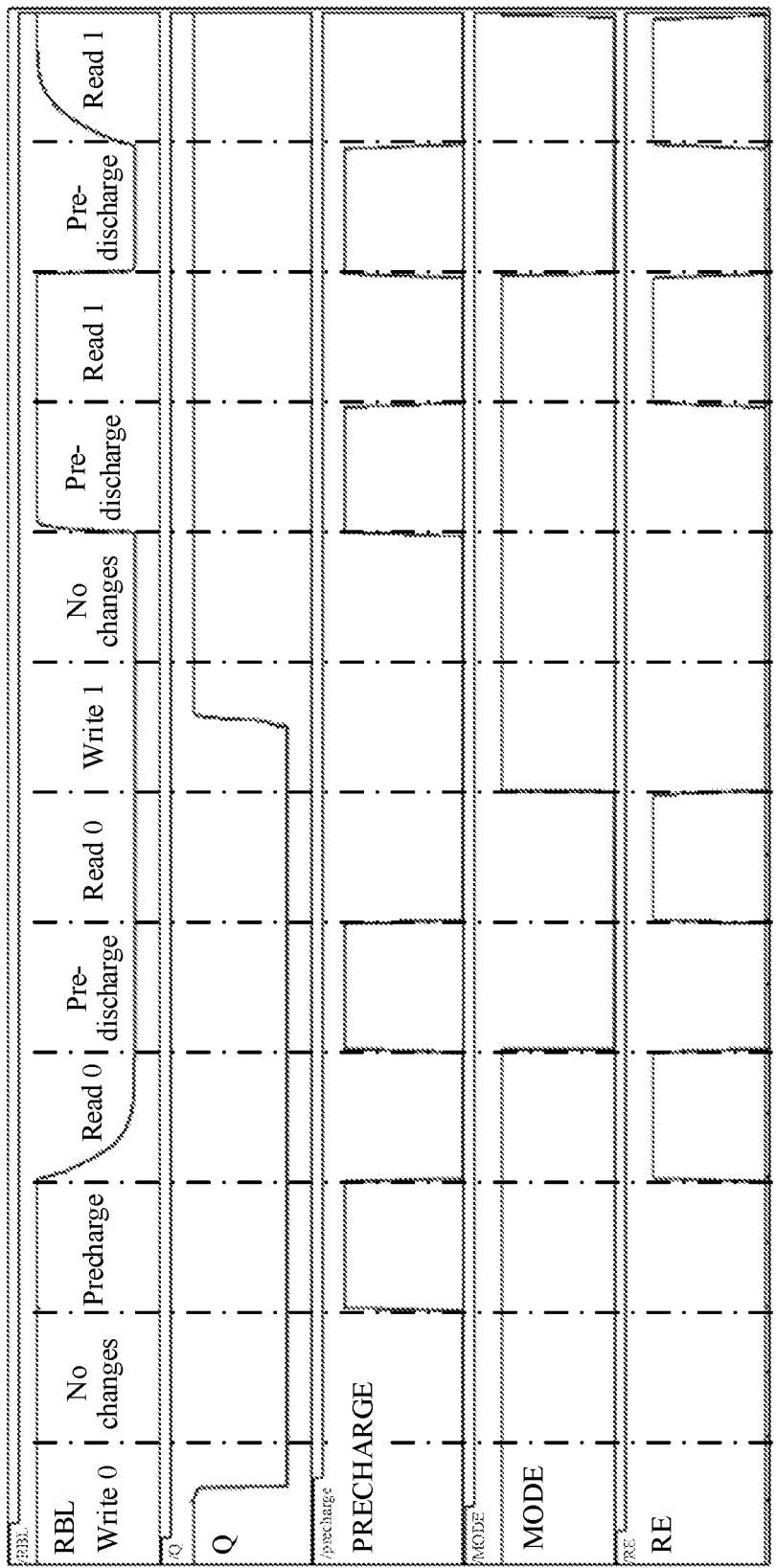
FIG. 7b is a sequence diagram of working of an SRAM unit according to an embodiment of this application.

In a possible implementation, the read control circuit 804 includes a fifth pull-up transistor P5, a fifth pull-down transistor N5, a first either-or switch Q1, and a second either-or switch Q2 shown in FIG. 7b. A source of the fifth pull-up transistor P5 is connected to a power supply, a gate of the fifth pull-up transistor P5 is connected to an output end of the first either-or switch Q1, and a drain of the fifth pull-up transistor P5 is connected to one end of the read bit line corresponding to a column of SRAM units that are connected to the read control circuit 804 and that are in the SRAM storage array. A first input end of the first either-or switch Q1 is connected to a power supply VCC, a second input end of the first either-or switch Q1 is configured to input the phase-inverted signal $\overline{\text{PRECHARGE}}$ of the precharge signal, and a control end of the first either-or switch is configured to input the first read control signal MODE1 or the second read control signal MODE2. A drain of the fifth pull-down transistor N5 is connected to the read bit line corresponding to the column of SRAM units that are connected to the read control circuit 804 and that are in the SRAM storage array, a gate of the fifth pull-down transistor N5 is connected to an output end of the second either-or switch Q2, and a source of the fifth pull-down transistor N5 is grounded. A first input end of the second either-or switch Q2 is configured to input the precharge signal PRECHARGE, a second input end of the second either-or switch Q2 is grounded, and a control end of the second either-or switch Q2 is configured to input the first read control signal MODE1 or the second read control signal MODE2.

Figure 11:
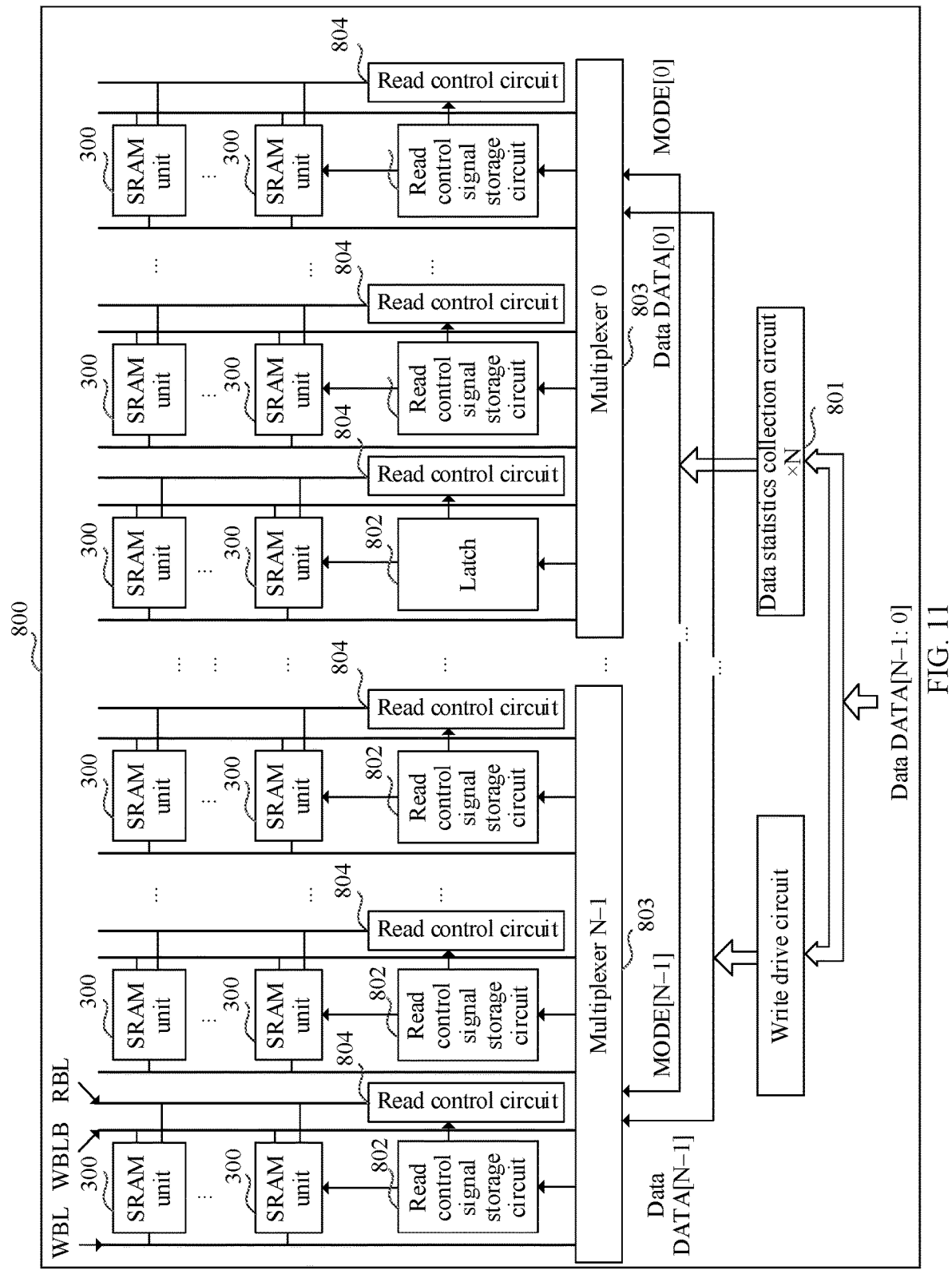
FIG. 11 is a specific schematic structural diagram of an SRAM according to an embodiment of this application.

Specifically, when the SRAM memory 800 has the data statistics collection circuits 801, the read control signal storage circuits 802, and the N multiplexers 803 shown in FIG. 9, and the read control circuit 804 shown in FIG. 10, a structure is shown in FIG. 11. The read control circuit 804 obtains the first read control signal MODE1 or the second read control signal MODE2 through the corresponding read control signal storage circuit 802.

The following uses an example in which the SRAM memory 800 provided in this embodiment of this application is in a Spectre simulation environment, a circuit is simulated by using an SMIC 65-nm process, and a typical convolutional neural network is used, to evaluate average power consumption of reading the SRAM memory 800 based on access features of an initial image and a neuron. An experimental result shows that in reading an original image, the SRAM unit 300 provided in this embodiment of this application saves an average of 64% energy compared with an existing 6T-SRAM unit, and saves 46% energy compared with an 8T-SRAM unit. Especially, in an MNIST data set, saved proportions can reach 87% and 86% respectively. In reading neuron data, the SRAM unit 300 provided in this embodiment of this application saves an average of 67% energy compared with the 6T-SRAM unit, and saves an average of 53% energy compared with the 8T-SRAM unit. Especially, when an AlexNet neural network is processed, the SRAM unit 300 can save 73% energy compared with the 6T-SRAM unit, as shown in Table 1, and can save 67% energy compared with the 8T-SRAM unit, as shown in Table 2.

TABLE 1

Average power consumption of reading an original image

| SRAM unit | Data set | | |
|---|---|---|---|
| | MNIST | Cifar-10 | ISLVRC-2012 |
| 6T-SRAM unit | 4.50fJ | 4.50fJ | 4.50fJ |
| 8T-SRAM unit | 4.26fJ | 2.32fJ | 2.45fJ |
| SRAM unit in this application | 0.58fJ | 2.39fJ | 1.90fJ |

TABLE 2

Average power consumption of reading neuron data

| SRAM unit | CNN algorithm | | | | | |
|---|---|---|---|---|---|---|
| | Lenet-5 | AlexNet | VGG16 | VGG19 | Res-18 | Res-50 |
| 6T-SRAM unit | 4.50fJ | 4.50fJ | 4.50fJ | 4.50fJ | 4.50fJ | 4.50fJ |
| 8T-SRAM unit | 3.52fJ | 3.73fJ | 3.05fJ | 3.21fJ | 2.90fJ | 2.96fJ |
| SRAM unit in this application | 2.04fJ | 1.22fJ | 1.39fJ | 1.45fJ | 1.41fJ | 1.45fJ |

It should be understood that the SRAM memory 800 provided in this embodiment of this application is a complete SRAM memory, and also has a structure, such as a row address decoder, a column address decoder, a sense amplifier, and a buffer/drive circuit, of a known SRAM. Only a component that is in the SRAM 800 and that is used to reduce power consumption of the SRAM is described herein. Details of other components are not described.

In the foregoing solution, the SRAM memory 800 can adjust a working structure of the SRAM memory 800 based on a quantity of SRAM units that store the first data and that are in a column of SRAM units of the SRAM memory 800, and a quantity of SRAM units that store the second data and that are in the column, to reduce as much as possible energy consumed, during a read operation on the SRAM unit of the SRAM memory 800, by charging the read bit line connected to the SRAM unit, thereby reducing power consumption of the SRAM memory 800.

It should be noted that in the foregoing embodiments, the power supply connected to the source of the second pull-up transistor P2, the power supply connected to the source of the third pull-up transistor P3, the power supply connected to the source of the fourth pull-up transistor P4, the power supply connected to the source of the fifth pull-up transistor P5, and the power supply connected to the first input end of the first either-or switch Q1 may be a same power supply or different power supplies.

Figure 12:
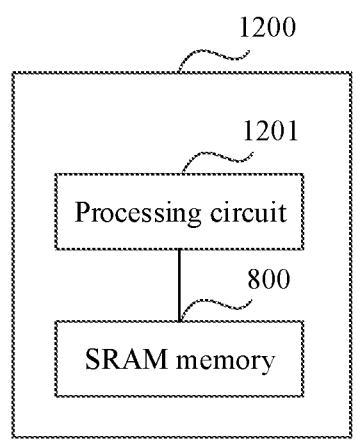
FIG. 12 is a schematic structural diagram of a processing circuit chip according to an embodiment of this application.

Based on the foregoing embodiments, this application further provides a processing circuit chip. The processing circuit chip 1200 includes an SRAM 800 and one or more processing circuits 1201. The SRAM memory 800 is configured to store data required when the one or more processing circuits 1201 run, as shown in FIG. 12.

The processing circuit 1201 may be a core (for example, an ARM core), or may be a hardware circuit implemented based on an application-specific integrated circuit (ASIC), a programmable logic device (PLD), a combination thereof, or the like. The PLD may be a complex programmable logic device (CPLD), a field-programmable gate array (FPGA), a generic array logic (GAL), or any combination thereof. For example, the processing circuit chip 1200 may be an application processor (AP) in a communications device (such as a mobile phone, a tablet computer, or a personal computer), or may be an accelerator in a neural network.

It should be understood that the processing circuit chip 1200 provided in this embodiment of this application may further be in a structure of another known processor, for example, an input/output interface.

According to the foregoing solution, the SRAM 800 in the processing circuit chip 1200 can adjust a working structure of each column of SRAM units in the SRAM memory 800 based on quantities of pieces of first data and second data stored in each column of SRAM units in the SRAM memory 800, to avoid as much as possible that charging a read bit line connected to the SRAM unit consumes energy during a read operation on the SRAM unit, to reduce power consumption of the SRAM memory, thereby improving performance (for example, a processing speed) of the processing circuit chip 1200.

In addition, this application further provides an electronic device. The electronic device includes a power supply and the processing circuit chip 1200, and the power supply is configured to supply power to the processing circuit chip 1200.

It is clearly that persons skilled in the art can make various modifications and variations to the embodiments of this application without departing from the spirit and scope of the embodiments of this application. This application is intended to cover these modifications and variations provided that they fall within the scope of protection defined by the following claims and their equivalent technologies.

What is claimed is:

1. A static random access memory (SRAM) unit, located in an SRAM, wherein:
   the SRAM comprises an SRAM storage array comprising a plurality of SRAM units, and the SRAM unit comprises a storage circuit, a write circuit, and a read circuit;
   the storage circuit is connected to each of the write circuit and the read circuit, and is configured to store data, wherein the data is first data or second data, the first data is represented by a high level, and the second data is represented by a low level;
   the write circuit is further connected to a write word line and a write bit line, and is configured to write data into the storage circuit;
   the read circuit is further connected to a read enabling signal end and a read bit line, wherein when a first quantity of SRAM units that store the first data and that are in a column of the SRAM unit in the SRAM storage array is greater than a second quantity of SRAM units that store the second data and that are in the column, the read bit line is charged to the high level after the SRAM receives a read command and before a read enabling signal at the read enabling signal end is valid, and when the first quantity is less than the second quantity, the read bit line is discharged to the low level after the SRAM receives the read command and before the read enabling signal is valid;
   the read circuit is configured to enable data on the read bit line to be the data stored in the storage circuit after the read enabling signal is valid
   the read circuit comprises a first pull-up transistor, a first pull-down transistor, a first read transmission transistor, and a second read transmission transistor;
   a gate of the first pull-up transistor is connected to each of a gate of the first pull-down transistor and the storage circuit, a source of the first pull-up transistor is connected to a drain of a second pull-up transistor, and a drain of the first pull-up transistor is connected to each of a drain of the first pull-down transistor, a source of the first read transmission transistor, and a drain of the second read transmission transistor;
   a source of the first pull-down transistor is connected to a drain of a second pull-down transistor, a source of the second pull-down transistor is grounded, and a source of the second pull-up transistor is connected to a power supply;
   a gate of the second pull-up transistor and a gate of the second pull-down transistor are used to receive a first read control signal or a second read control signal;
   when the gate of the second pull-up transistor and the gate of the second pull-down transistor receive the first read control signal, the second pull-up transistor is in an off state, and the second pull-down transistor is in an on state; and when the gate of the second pull-up transistor and the gate of the second pull-down transistor receive the second read control signal, the second pull-up transistor is in the on state, and the second pull-down transistor is in the off state;
   a drain of the first read transmission transistor is connected to each of a source of the second read transmission transistor and the read bit line, a gate of the first read transmission transistor is connected to a first read enabling signal end, and a gate of the second read transmission transistor is connected to a second read enabling signal end;
   when a first read enabling signal at the first read enabling signal end is valid, and a second read enabling signal at the second read enabling signal end is valid, both the first read transmission transistor and the second read transmission transistor are in the on state; and
   the read enabling signal end comprises the first read enabling signal end and the second read enabling signal end, the read enable signal comprises the first read enable signal and the second read enable signal, and the second read enabling signal is a phase-inverted signal of the first read enabling signal.

2. The SRAM unit according to claim 1, wherein the first pull-up transistor, the second pull-up transistor, and the first read transmission transistor are P-channel field-effect transistors, and the first pull-down transistor, the second pull-down transistor, and the second read transmission transistor are N-channel field-effect transistors.

3. The SRAM unit according to claim 1, wherein the storage circuit comprises a third pull-up transistor, a fourth pull-up transistor, a third pull-down transistor, and a fourth pull-down transistor;
   wherein both a source of the third pull-up transistor and a source of the fourth pull-up transistor are connected to the power supply;
   wherein a gate of the third pull-up transistor is connected to each of a gate of the third pull-down transistor, a drain of the fourth pull-up transistor, a drain of the fourth pull-down transistor, the read circuit, and the write circuit;
   wherein a gate of the fourth pull-up transistor is connected to each of a gate of the fourth pull-down transistor, a drain of the third pull-up transistor, a drain of the third pull-down transistor, and the write circuit; and
   wherein both a source of the third pull-down transistor and a source of the fourth pull-down transistor are grounded.

4. The SRAM unit according to claim 3, wherein the third pull-up transistor and the fourth pull-up transistor are P-channel field-effect transistors, and the third pull-down transistor and the fourth pull-down transistor are N-channel field-effect transistors.

5. The SRAM unit according to claim 3, wherein the write circuit comprises a first write transmission transistor and a second write transmission transistor;
   wherein a source of the first write transmission transistor is connected to a first write bit line, a gate of the first write transmission transistor is connected to the write word line, and a drain of the first write transmission transistor is connected to each of the drain of the third pull-up transistor and the gate of the fourth pull-up transistor, a drain of the second write transmission transistor is connected to each of the drain of the fourth pull-up transistor and the gate of the third pull-up transistor, a source of the second write transmission transistor is connected to a second write bit line, and a gate of the second write transmission transistor is connected to the write word line;
   wherein the write bit line comprises the first write bit line and the second write bit line;
   wherein when the write circuit writes data into the storage circuit, both the first write transmission transistor and the second write transmission transistor are in the on state; and
   wherein the first write bit line and the second write bit line have inverted phases.

6. The SRAM unit according to claim 5, wherein both the first write transmission transistor and the second write transmission transistor are N-channel field-effect transistors.

7. A static random access memory (SRAM), comprising an SRAM storage array comprising a plurality of SRAM units, and the SRAM unit comprises a storage circuit, a write circuit, and a read circuit;
   wherein the storage circuit is connected to each of the write circuit and the read circuit, and is configured to store data;
   wherein the write circuit is connected to a write word line and a write bit line, and is configured to write data into the storage circuit;
   wherein the read circuit is connected to a read enabling signal end and a read bit line and is configured to enable data on the read bit line to be the data stored in the storage circuit after the read enabling signal is valid;
   wherein the SRAM further comprises N data statistics collection circuits, N multiplexers, and M×N read control signal storage circuits, wherein N is equal to a data bit width, each bit of data corresponding to the data bit width corresponds to M columns in an SRAM storage array, the N data statistics collection circuits are in a one-to-one correspondence with the N multiplexers, and the SRAM storage array comprises M×N columns of SRAM units;
   wherein each of the N data statistics collection circuits is connected to M of the read control signal storage circuits through a corresponding multiplexer, and each of the M×N read control signal storage circuits is connected to one column of SRAM units in the SRAM storage array;
   wherein the data statistics collection circuit is configured to: collect statistics on a quantity of pieces of first data and a quantity of pieces of second data in data that needs to be written into a target SRAM unit, wherein the target SRAM unit is a column of SRAM units that are connected to the data statistics collection circuit and that are in the SRAM storage array; when the quantity of pieces of first data is greater than the quantity of pieces of second data, generate a first read control signal used to control a read bit line to be charged to a high level; and when the quantity of pieces of first data is less than the quantity of pieces of second data, generate a second read control signal used to control the read bit line to be discharged to a low level; and
   wherein a read control signal storage circuit connected to the target SRAM unit is configured to store the first read control signal or the second read control signal, wherein the first read control signal is at a high level and the second read control signal is at a low level.

8. The SRAM according to claim 7, further comprising: M×N data statistics collection circuits and M×N read control signal storage circuits, wherein N is equal to a data bit width, each bit of data corresponding to the data bit width corresponds to M columns in an SRAM storage array, the SRAM storage array comprises M×N columns of SRAM units, the M×N data statistics collection circuits are in a one-to-one correspondence with the M×N columns of SRAM units, and each of the data statistics collection circuits is connected to one column of SRAM units through one of the read control signal storage circuits;
   wherein the data statistics collection circuit is configured to: collect statistics on a quantity of pieces of first data and a quantity of pieces of second data in data that needs to be written into a target SRAM unit, wherein the target SRAM unit is a column of SRAM units that are connected to the data statistics collection circuit and that are in the SRAM storage array; when the quantity of pieces of first data is greater than the quantity of pieces of second data, generate a first read control signal used to control a read bit line to be charged to a high level; and when the quantity of pieces of first data is less than the quantity of pieces of second data, generate a second read control signal used to control the read bit line to be discharged to a low level; and
   wherein a read control signal storage circuit connected to the target SRAM unit is configured to store the first read control signal or the second read control signal, wherein the first read control signal is at a high level and the second read control signal is at a low level.

9. The SRAM according to claim 7, wherein the read control signal storage circuit is a latch.

10. The SRAM according to claim 7, further comprising M×N read control circuits, wherein N is equal to the data bit width, and each of the M×N read control circuits is connected to one column of SRAM units in the SRAM storage array through a corresponding read bit line; and
   wherein the read control circuit is configured to: after the SRAM receives a read command and before a read enabling signal of a column of SRAM units connected to the read control circuit is valid, under control of the first read control signal and a phase-inverted signal of a precharge signal, charge, to a high level, a read bit line corresponding to the column of SRAM units connected to the read control circuit; or
   wherein the read control circuit is configured to: after the SRAM receives a read command and before the read enabling signal of a column of SRAM units connected to the read control circuit is valid, under control of the second read control signal and a precharge signal, discharge, to a low level, a read bit line corresponding to the column of SRAM units connected to the read control circuit.

11. The SRAM according to claim 10, wherein the read control circuit comprises a fifth pull-up transistor, a fifth pull-down transistor, a first either-or switch, and a second either-or switch;
- wherein a source of the fifth pull-up transistor is connected to a power supply, a gate of the fifth pull-up transistor is connected to an output end of the first either-or switch, and a drain of the fifth pull-up transistor is connected to the read bit line corresponding to the column of SRAM units that are connected to the read control circuit and that are in the SRAM storage array;
- wherein a first input end of the first either-or switch is connected to the power supply, a second input end of the first either-or switch is configured to input the phase-inverted signal of the precharge signal, and a control end of the first either-or switch is configured to input the first read control signal or the second read control signal;
- wherein a drain of the fifth pull-down transistor is connected to the read bit line corresponding to the column of SRAM units that are connected to the read control circuit and that are in the SRAM storage array, a gate of the fifth pull-down transistor is connected to an output end of the second either-or switch, and a source of the fifth pull-down transistor is grounded;
- wherein a first input end of the second either-or switch is configured to input the precharge signal, a second input end of the second either-or switch is grounded, and a control end of the second either-or switch is configured to input the first read control signal or the second read control signal;
- wherein when the first read control signal is input into the control end of the first either-or switch and the control end of the second either-or switch, and the phase-inverted signal of the precharge signal is valid, the output end of the first either-or switch is connected to the first input end of the first either-or switch, the fifth pull-up transistor is in an on state, the output end of the second either-or switch is connected to the first input end of the second either-or switch, and the fifth pull-down transistor is in an off state; and
- wherein when the second read control signal is input into the control end of the first either-or switch and the control end of the second either-or switch, and the precharge signal is valid, the output end of the first either-or switch is connected to the second input end of the first either-or switch, the fifth pull-up transistor is in an off state, the output end of the second either-or switch is connected to the second input end of the second either-or switch, and the fifth pull-down transistor is in an on state.

12. The SRAM according to claim 11, wherein the fifth pull-up transistor is a P-channel field-effect transistor, and the fifth pull-down transistor is an N-channel field-effect transistor.

13. A processing circuit chip, comprising a static random access memory (SRAM) and one or more processing circuits, wherein the SRAM is configured to store data when the one or more processing circuits run;
- wherein the SRAM unit comprises a storage circuit, a write circuit, and a read circuit;
- wherein the storage circuit is connected to each of the write circuit and the read circuit, and is configured to store data;
- wherein the write circuit is connected to a write word line and a write bit line, and is configured to write data into the storage circuit;
- wherein the read circuit is connected to a read enabling signal end and a read bit line and is configured to enable data on the read bit line to be the data stored in the storage circuit after the read enabling signal is valid;
- wherein the SRAM further comprises N data statistics collection circuits, N multiplexers, and M×N read control signal storage circuits, wherein N is equal to a data bit width, each bit of data corresponding to the data bit width corresponds to M columns in an SRAM storage array, the N data statistics collection circuits are in a one-to-one correspondence with the N multiplexers, and the SRAM storage array comprises M×N columns of SRAM units;
- wherein each of the N data statistics collection circuits is connected to M of the read control signal storage circuits through a corresponding multiplexer, and each of the M×N read control signal storage circuits is connected to one column of SRAM units in the SRAM storage array;
- wherein the data statistics collection circuit is configured to: collect statistics on a quantity of pieces of first data and a quantity of pieces of second data in data that needs to be written into a target SRAM unit, wherein the target SRAM unit is a column of SRAM units that are connected to the data statistics collection circuit and that are in the SRAM storage array; when the quantity of pieces of first data is greater than the quantity of pieces of second data, generate a first read control signal used to control a read bit line to be charged to a high level; and when the quantity of pieces of first data is less than the quantity of pieces of second data, generate a second read control signal used to control the read bit line to be discharged to a low level; and
- wherein a read control signal storage circuit connected to the target SRAM unit is configured to store the first read control signal or the second read control signal, wherein the first read control signal is at a high level and the second read control signal is at a low level.

* * * * *